United States Patent
Miyairi et al.

(10) Patent No.: US 7,015,079 B2
(45) Date of Patent: Mar. 21, 2006

(54) SEMICONDUCTOR FILM, SEMICONDUCTOR DEVICE, AND METHOD OF MANUFACTURING THE SAME INCLUDING ADDING METALLIC ELEMENT TO THE AMORPHOUS SEMICONDUCTOR FILM AND INTRODUCING OXYGEN AFTER CRYSTALLIZATION

(75) Inventors: Hidekazu Miyairi, Atsugi (JP); Aiko Shiga, Atsugi (JP); Katsumi Nomura, Osaka (JP); Naoki Makita, Osaka (JP); Takuya Matsuo, Osaka (JP)

(73) Assignees: Semiconductor Energy Laboratory Co., Ltd., Kanagawa-ken (JP); Sharp Kabushiki Kaisha, Osaka (JP)

( * ) Notice: Subject to any disclaimer, the term of this patent is extended or adjusted under 35 U.S.C. 154(b) by 138 days.

(21) Appl. No.: 10/771,404

(22) Filed: Feb. 5, 2004

(65) Prior Publication Data

US 2004/0157413 A1   Aug. 12, 2004

Related U.S. Application Data

(62) Division of application No. 10/265,634, filed on Oct. 8, 2002, now Pat. No. 6,777,713.

(30) Foreign Application Priority Data

Oct. 9, 2001   (JP) ............................. 2001-311756

(51) Int. Cl.
    H01L 21/00   (2006.01)
    H01L 21/84   (2006.01)
    H01L 21/20   (2006.01)
    H01L 21/36   (2006.01)

(52) U.S. Cl. ...................... 438/149; 438/151; 438/166; 438/487; 438/490

(58) Field of Classification Search ................ 438/30, 438/62, 149, 150, 151, 166, 487, 490
See application file for complete search history.

(56) References Cited

U.S. PATENT DOCUMENTS

5,352,291 A    10/1994   Zhang et al. .................. 117/8

(Continued)

FOREIGN PATENT DOCUMENTS

JP         07-183540         7/1995

(Continued)

OTHER PUBLICATIONS

Katsuyuki Suga et al., "P-3: The Effect of a Laser Annealing Ambient on the Morphology and TFT Performance of Poly-Si Films," SID 00 DIGEST, pp. 534-537.

*Primary Examiner*—William M. Brewster
(74) *Attorney, Agent, or Firm*—Eric J. Robinson; Robinson Intellectual Property Law Office, P.C.

(57) ABSTRACT

By adding a novel improvement to the technique disclosed in JP 8-78329 A, a manufacturing method in which film characteristics of a semiconductor film having a crystalline structure are improved is provided. In addition, a TFT having superior TFT characteristics, such as field effect mobility, which uses the semiconductor film as an active layer, and a method of manufacturing the TFT, are also provided. A metallic element which promotes the crystallization of silicon is added to a semiconductor film having an amorphous structure and an oxygen concentration within the film of less than $5 \times 10^{18}/cm^3$. The semiconductor film having an amorphous structure is then heat-treated, forming a semiconductor film having a crystalline structure. Subsequently, an oxide film on the surface is removed. Oxygen is introduced to the semiconductor film having a crystalline structure, and processing is performed such that the concentration of oxygen within the film is from $5 \times 10^{18}/cm^3$ to $1 \times 10^{21}/cm^3$. After removing an oxide film on the surface of the semiconductor film, the semiconductor film surface is leveled by irradiating laser light under an inert gas atmosphere or in a vacuum.

18 Claims, 11 Drawing Sheets

U.S. PATENT DOCUMENTS

| | | | | |
|---|---|---|---|---|
| 5,578,520 | A | 11/1996 | Zhang et al. | 438/487 |
| 5,643,826 | A | 7/1997 | Ohtani et al. | 438/162 |
| 5,683,937 | A | 11/1997 | Furukawa et al. | 438/42 |
| 5,789,284 | A | 8/1998 | Yamazaki et al. | 438/166 |
| 5,861,337 | A | 1/1999 | Zhang et al. | 438/437 |
| 5,880,487 | A | 3/1999 | Furukawa et al. | 257/99 |
| 5,937,282 | A * | 8/1999 | Nakajima et al. | 438/149 |
| 6,027,960 | A | 2/2000 | Kusumoto et al. | 438/166 |
| 6,096,581 | A | 8/2000 | Zhang et al. | 438/149 |
| 6,242,292 | B1 | 6/2001 | Yamazaki et al. | 438/166 |
| 6,300,176 | B1 | 10/2001 | Zhang et al. | 438/166 |
| 6,348,369 | B1 | 2/2002 | Kusumoto et al. | 438/166 |
| 6,777,274 | B1 * | 8/2004 | Moon et al. | 438/166 |

FOREIGN PATENT DOCUMENTS

| | | |
|---|---|---|
| JP | 08-078329 | 3/1996 |
| JP | 10-106951 | 4/1998 |
| JP | 2001-60551 | 3/2001 |

* cited by examiner

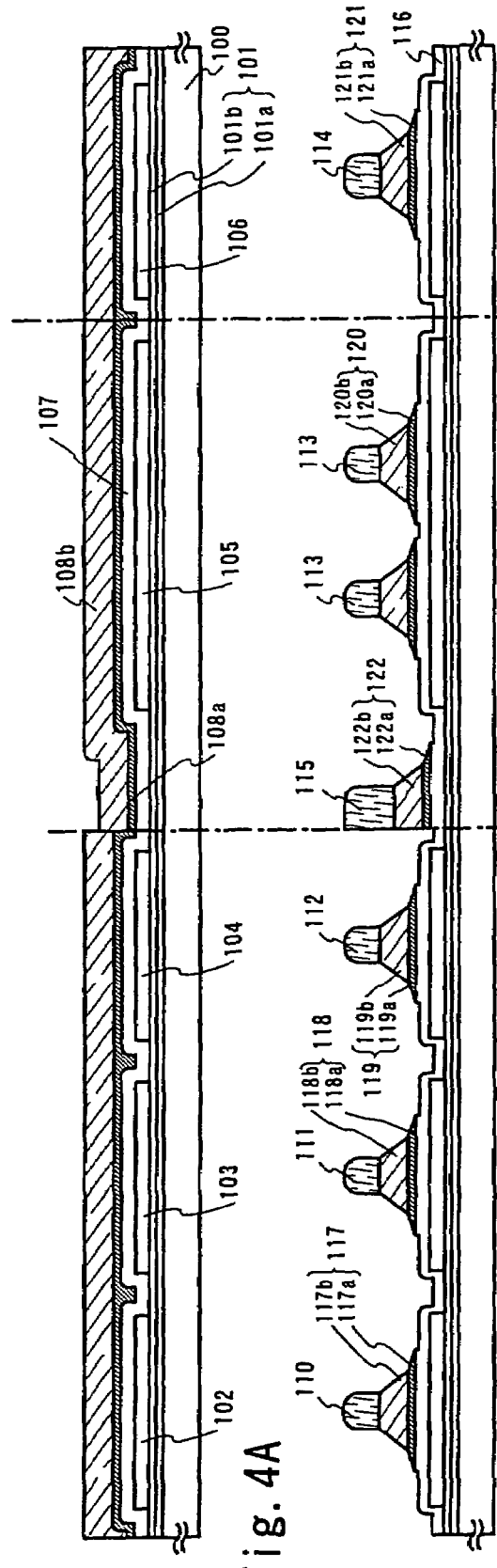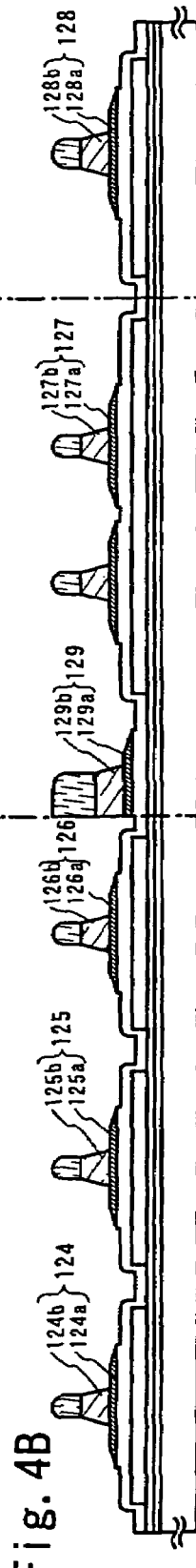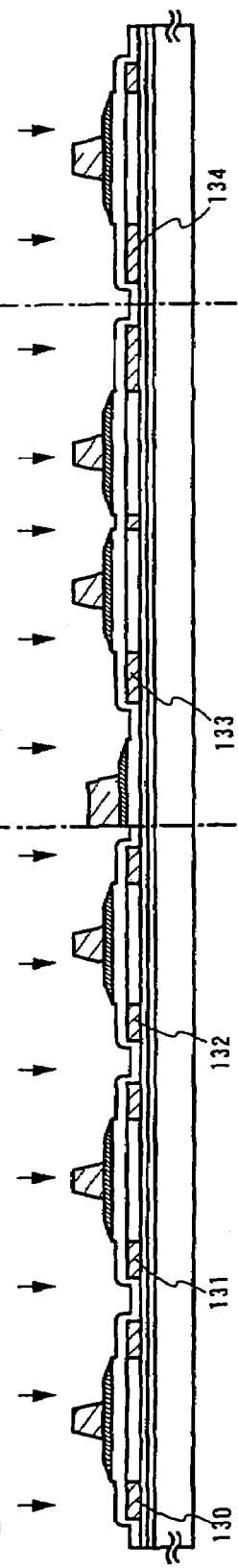

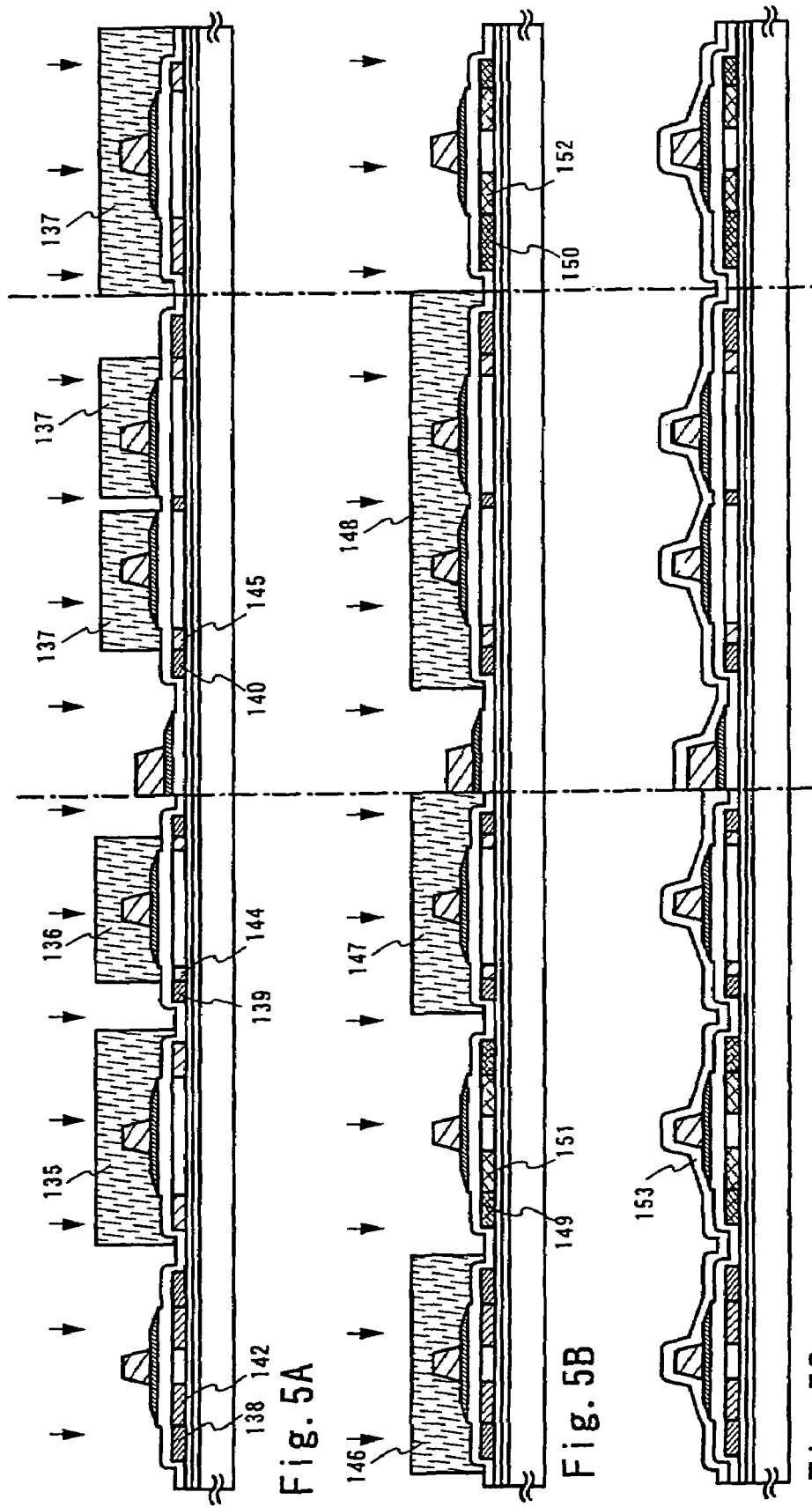

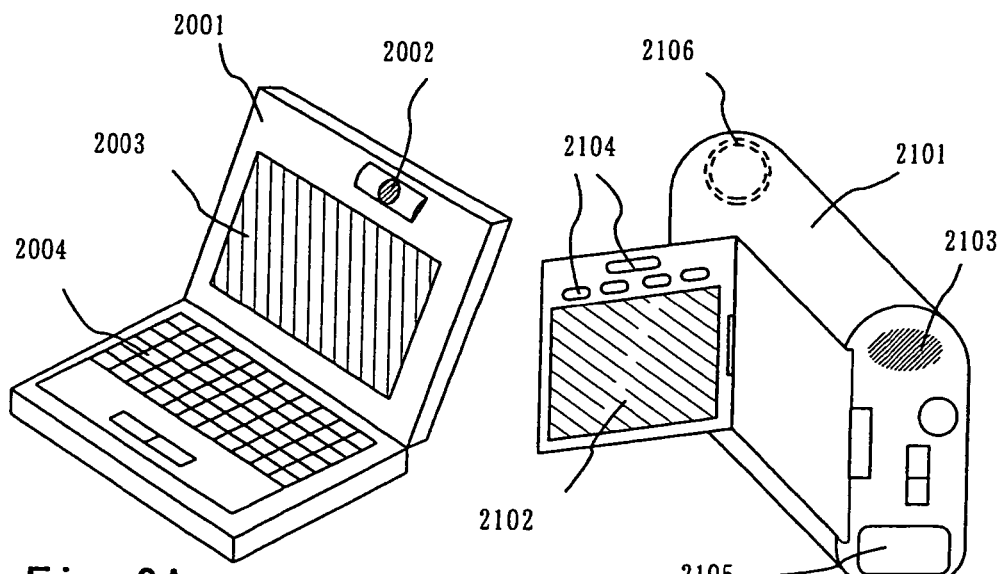
Fig. 9A
Fig. 9B
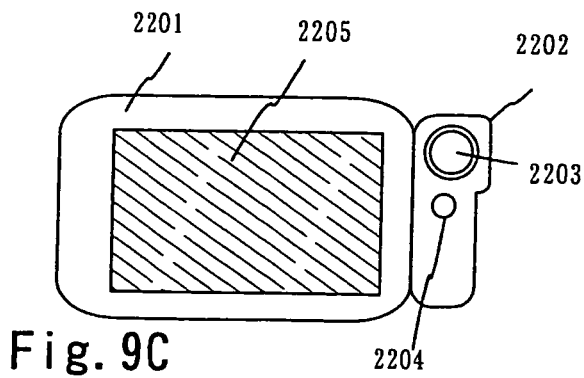
Fig. 9C
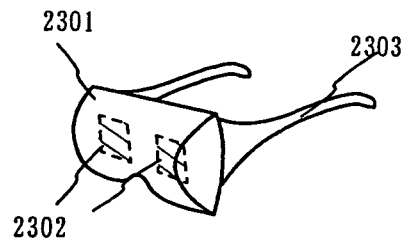
Fig. 9D
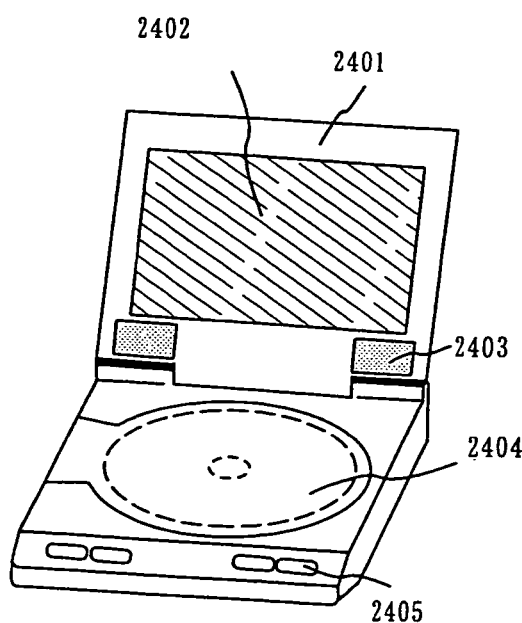
Fig. 9E
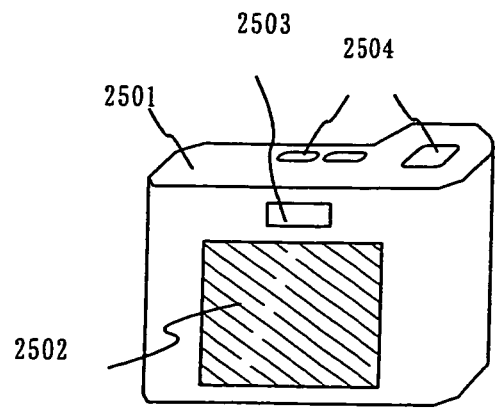
Fig. 9F

SEMICONDUCTOR FILM, SEMICONDUCTOR DEVICE, AND METHOD OF MANUFACTURING THE SAME INCLUDING ADDING METALLIC ELEMENT TO THE AMORPHOUS SEMICONDUCTOR FILM AND INTRODUCING OXYGEN AFTER CRYSTALLIZATION

BACKGROUND OF THE INVENTION

1. Field of the Invention

The present invention relates to a semiconductor device having a circuit composed of thin film transistors (hereinafter, referred to as TFTs) and a method of manufacturing the semiconductor device. For example, the present invention relates to an electro-optical device typified by a liquid crystal display panel and an electronic equipment mounted with the electro-optical device as a component.

Note that the term semiconductor device in this specification indicates devices in general capable of functioning with the use of semiconductor characteristics, and electro-optical devices, semiconductor circuits and electronic equipment are all included in the category of the semiconductor device.

2. Description of the Related Art

In recent years, a technology of constituting a thin film transistor (TFT) by using a semiconductor thin film (with a thickness of approximately several to several hundred of nm) formed on a substrate having an insulating surface has attracted attention. The thin film transistor is widely applied to an electronic device such as an IC or an electro-optical device, and needs to be developed promptly as, in particular, a switching element of an image display device.

An active matrix liquid crystal module is known as a typical example of the thin film transistors. Particularly, a TFT having a silicon film having a crystalline structure (typically, polysilicon film) as an active layer (hereafter, referred to as polysilicon TFT) has high filed-effect mobility compare to a TFT having a silicon film having a amorphous structure (typically, amorphous silicon film), and thus such TFTs are multiused recently.

Although there are various technologies of obtaining the silicon film having crystalline structure, especially, a technology given in Japanese Unexamined Patent Publication No. Hei. 8-78329 official report, in which the metallic elements (typically nickel) promoting crystallization to an amorphous silicon film are added alternatively, thereby performing a heat treatment to form the crystalline silicon film which spreads with an addition region as the starting point. Since the size of the crystal grain obtained thereof is very large compared with other technologies, and the field effect mobility is high, various circuits equipped with various functions can be formed thereby. For example, in case of using the technology of the above-mentioned official report, to a liquid crystal module carried in a liquid crystal display device, drive circuits for controlling pixel portions, such as pixel portions which perform an image display for every functional block, a shift register circuit based on a CMOS circuit, a level shifter circuit, a buffer circuit, and a sampling circuit, and the like can form on one substrate.

Moreover, the above-mentioned official report technology can lower approximately 50–100° C. crystallization temperature of an amorphous silicon film by the action of metallic elements compared to a method without using metallic elements, thereby a glass substrate can be used without any problems occurring in process. Moreover, required time in the crystallization of the above-mentioned official report technology can be reduced to $\frac{1}{5}$–$\frac{1}{10}$ compared to the method without using metallic elements, thereby the above-mentioned official report technology is also excellent in productivity.

SUMMARY OF THE INVENTION

A new further improvement is added to the technology of the above-mentioned official report, the manufacturing method of improving the film characteristic of a semiconductor film having a crystalline structure, and TFTs in which such a semiconductor film used as an active layer, excellent in the TFTs characteristics, such as the field effect mobility, are offered.

Considering the results of many experiments performed from a wide variety of fields in order to resolve the aforementioned various problems has lead to the present invention. When heat treatment is performed for crystallization, it is preferable to reduce the concentration of oxygen, which impedes crystallization, within a semiconductor film having an amorphous structure to which a metallic element is added for promoting crystallization, to a value as small as possible, specifically to less than $5 \times 10^{18}/cm^3$. It was discovered that the above problems can be resolved, in particular field effect mobility can be increased, by performing the introduction of oxygen into the film after performing heat treatment.

The oxygen concentration within the film may be set from $5 \times 10^{18}/cm^3$ to $1 \times 10^{21}/cm^3$ by irradiating laser light under an inert gas atmosphere, or in a vacuum, after oxidizing a surface of the semiconductor having a crystalline structure by using ozone water as a processing of introducing oxygen into the semiconductor film having a crystalline structure.

Alternatively, the oxygen concentration within the film may be set from $5 \times 10^{18}/cm^3$ to $1 \times 10^{21}/cm^3$ by irradiating laser light under an atmosphere containing oxygen or water molecules as another process of introducing oxygen into the semiconductor film having a crystalline structure.

In addition, the oxygen concentration within the film may be set from $5 \times 10^{18}/cm^3$ to $1 \times 10^{21}/cm^3$ by irradiating laser light under an inert gas atmosphere, or in a vacuum, after performing oxidation under an atmosphere containing oxygen or water molecules by using an electric furnace or the like.

Further, the oxygen concentration within the film may be set from $5 \times 10^{18}/cm^3$ to $1 \times 10^{21}/cm^3$ by irradiating laser light under an inert gas atmosphere, or in a vacuum, after adding oxygen by ion doping or ion implantation so that the oxygen concentration within the semiconductor film becomes $5 \times 10^{18}/cm^3$ to $1 \times 10^{18}/cm^3$. Furthermore, the semiconductor film is melted instantaneously from the surface, after which the melted semiconductor film is cooled and solidified from the substrate side because of thermal conduction to the substrate, for cases in which laser light is irradiated to the semiconductor film. Recrystallization takes place during the solidification process, and the semiconductor film becomes the one having a crystalline structure with a large grain size, but volumetric expansion develops due to the temporary melting, and unevenness referred to as ridges forms in the semiconductor-surface. In particular, the surface on which the ridges form becomes an interface with a gate insulating film for top gate TFTs, and therefore the element characteristics vary greatly.

In addition to the above processes, the oxide film on the semiconductor film surface is removed after laser light irradiation according to the present invention, and in addition, laser light is then irradiated under an inert gas atmosphere, or in a vacuum to level the surface of the semiconductor film having a crystalline structure.

Note that, differing from a technique for performing crystallization of the film having an amorphous structure by a first laser light and leveling by using a second laser light (JP 2001-60551 A), the present invention concerns irradiating the first laser light to the semiconductor film having a crystalline structure. Further, the present invention is the one in which a metallic element for promoting crystallization is added, a semiconductor film having a crystalline structure is formed, and levelness is additionally increased by the addition of the metallic element.

A first aspect of the present invention disclosed by this specification relates to a method of manufacturing a semiconductor device, including:

a first step of forming a semiconductor film having an amorphous structure on an insulating surface;

a second step of adding a metallic element to the semiconductor film having an amorphous structure;

a third step of heat-treating the semiconductor film having an amorphous structure to form a semiconductor film having a crystalline structure, and then removing an oxide film from the crystalline semiconductor film surface;

a fourth step of introducing oxygen into the semiconductor film having a crystalline structure to make an oxygen concentration within the film from $5\times10^{18}/cm^3$ to $1\times10^{21}/cm^3$;

a fifth step of removing an oxide film on the surface of the semiconductor film having a crystalline structure; and a sixth step of irradiating laser light under an inert gas atmosphere or in a vacuum to level the surface of the semiconductor film having a crystalline structure.

Further, although the oxide film is formed on the surface when heat-treating the semiconductor film having an amorphous structure, the process of introducing oxygen may also be performed without removing the oxide film. A second aspect of the present invention relates to another method of manufacturing a semiconductor device, including:

a first step of forming a semiconductor film having an amorphous structure on an insulating surface;

a second step of adding a metallic element to the semiconductor film having an amorphous structure;

a third step of heat-treating the semiconductor film having an amorphous structure to form a semiconductor film having a crystalline structure;

a fourth step of introducing oxygen into the semiconductor film having a crystalline structure to make the oxygen concentration within the film from $5\times10^{18}/cm^3$ to $1\times10^{21}/cm^3$;

a fifth step of removing an oxide film on the surface of the semiconductor film having a crystalline structure; and a sixth step of irradiating laser light under an inert gas atmosphere or in a vacuum to level the surface of the semiconductor film having a crystalline structure.

Furthermore, in the present invention, although the metallic element for promoting crystallization (typically Ni) is added onto the semiconductor film having an amorphous structure so as to cause crystallization, it is preferable that the metallic element for promoting crystallization be removed by a gettering technique or the like after crystallization. A third aspect of the present invention relates to another method of manufacturing a semiconductor device, including:

a first step of forming a semiconductor film having an amorphous structure on an insulating surface;

a second step of adding a metallic element to the semiconductor film having an amorphous structure;

a third step of heat-treating the semiconductor film having an amorphous structure to form a semiconductor film having a crystalline structure, and then removing an oxide film from the crystalline semiconductor film surface;

a fourth step of introducing oxygen into the semiconductor film having a crystalline structure to make the oxygen concentration within the film from $5\times10^{18}/cm^3$ to $1\times10^{21}/cm^3$;

a fifth step of removing an oxide film on the surface of the semiconductor film having a crystalline structure;

a sixth step of irradiating laser light under an inert gas atmosphere or in a vacuum to level the surface of the semiconductor film having a crystalline structure; and a seventh step of gettering the metallic element to remove the metallic element from, or reduce the concentration of the metallic element within, the semiconductor film having a crystalline structure.

Further, in each of the aforementioned aspects of the invention, the energy density of the laser light used in performing the sixth step is set to 430 to 560 mJ/cm$^2$, and the laser light irradiation performed by the fourth step uses laser light having an energy density that is lower by 30 to 60 mJ/cm$^2$ than that of the laser light used by the sixth step (between 400 and 500 mJ/cm$^2$).

Further, semiconductor films having the crystalline structure obtained by the above manufacturing method are included in the present invention. An aspect of a semiconductor device containing the semiconductor film having a crystalline structure of the present invention includes a TFT having:

a semiconductor layer having a channel formation region, a drain region, and a source region;

a gate insulating film; and a gate electrode, in which:

a metallic element is contained within the semiconductor layer at a concentration of $1\times10^{16}/cm^3$ to $5\times10^{18}/cm^3$; and average surface roughness (Ra value) of a surface of the semiconductor layer is equal to or less than 2 nm as obtained by AFM (atomic force microscopy).

Note that the metallic element in the above aspect is a metallic element for promoting crystallization of silicon, and is one element, or a plurality of elements, selected from the group consisting of Fe, Ni, Co, Ru, Rh, Pd, Os, Ir, Pt, Cu, and Au.

Further, extremely unique data on a state of the film surface is also obtained for the semiconductor film having a crystalline structure of the present invention, at the same time as data is obtained on superior levelness, by using AFM (atomic force microscopy). For cases in which a metallic element which promotes crystallization is not used, a tortoiseshell pattern is formed surrounded by ridges (portions in which microscopic convex portions extend continuously). An irregular mesh pattern in which several regions exist, divided by ridges extending in many directions as shown in FIG. 3, can be observed, however, as the surface state of the semiconductor film having a crystalline structure of the present invention in which crystallization is performed using a metallic element which promotes crystallization. Regions sandwiched by the ridges (level portions and concave portions) correspond well to an aggregation of crystal grains having the same crystal orientation (also referred to as domains).

The semiconductor film of the present invention has an irregular mesh pattern in the semiconductor film surface, as shown in FIG. 3. Ridges having convex portions extending out in a ridge shape diverge in many directions, and there is at least one pathway not obstructed by the ridges between two arbitrary points in a region containing level portions and concave portions sandwiched irregularly by the ridges. Note that the ridges are formed by performing laser light irradiation a plurality of times.

Further, the ridges having convex portions that extend out in a ridge shape with forming an irregular mesh pattern are formed in locations that nearly correspond to individual domain boundaries. The fact that the individual domain boundaries and the ridges nearly correspond can be verified by a method referred to as unique grain mapping (in which an electron beam is scanned over a sample, and from the crystal orientations found at each point, regions are classified in which crystal orientations have an angular shift less than 15° between two adjacent points at the respective measurement points). Here, SEM observation photograph and electron backscatter diffraction pattern (EBSP) are used in the analysis in the same region. That is, in addition to the fact that there is at least one pathway not obstructed by the ridges between two arbitrary points in a region containing level portions and concave portions sandwiched irregularly by the ridges, there is a pathway between two arbitrary points in a region sandwiched by domain boundaries in which the shift between adjacent points in crystal orientations is less than 15°. This can be expected to be a factor in obtaining a semiconductor film having superior electrical characteristics, in particular, superior field effect mobility.

Further, the above surface state and crystal orientation characteristics are characteristic of the present invention and cannot be obtained by another method. The characteristic can first be seen after adding a metallic element for promoting crystallization (typically nickel), crystallizing by performing heat treatment, and in addition, removing an oxide film on the semiconductor film surface after performing irradiation of a first laser light, and leveling the surface of the semiconductor film having a crystalline structure by irradiating laser light under an inert gas atmosphere or in a vacuum.

Also, in the aforementioned semiconductor film, a metallic element is contained therein at a concentration of $1\times10^{16}/cm^3$ to $5\times10^{18}/cm^3$. Furthermore, the semiconductor film is level, having an average surface roughness (Ra value) equal to or less than 2 nm.

Further, a semiconductor device having superior electrical characteristics can be obtained by using the semiconductor film as a portion of the semiconductor device, for example as an active layer of a TFT.

An aspect of a semiconductor device of the present invention includes a TFT having:
  a semiconductor layer having a channel formation region, a drain region, and a source region;
  a gate insulating film; and
  a gate electrode,
  in which:
  a surface of the semiconductor layer has an irregular mesh pattern;
  ridges having convex portions that extend out in a ridge shape diverge in many directions; and
  at least one pathway that is not obstructed by the ridges is provided between two arbitrary points in a region containing a level portion and a concave portion sandwiched irregularly by the ridges. A metallic element is contained within the aforementioned semiconductor layer at a concentration of $1\times10^{16}/cm^3$ to $5\times10^{18}/cm^3$. Furthermore, the semiconductor layer is level, having an average surface roughness (Ra value) equal to or less than 2 nm.

The crystalline structure for cases in which crystallization is performed by a conventional solid phase growth method becomes a twin structure, and a semiconductor film contains a large number of twin defects within the crystal grains. In contrast, a plurality of rod shape crystal grain aggregates (domains) are formed in a semiconductor film obtained by the present invention, and all of the crystal grains of a certain crystal grain aggregate (domain) can be considered to have the same crystal orientation. The size of the crystal grain aggregate (domain) is equal to or greater than approximately 1 μM, with the large ones having a size of several tens of micrometers.

Further, the number of defects contained in the grain boundaries within one domain (unbonded hands of silicon) is extremely small, and the electrical barrier is small, compared to the grain boundaries obtained by the conventional solid phase growth methods or the like. That is, the interior of one domain is approximately close to a single crystal, and it is thought that the film characteristics will become more superior, the larger the domain size becomes.

The term adjacent crystal aggregates (domains) refers to aggregates having different orientations with a boundary (portion in which a microscopic convex portion extends continuously) between the aggregates. Similarly, the surface state can also be observed by using SEM observation.

Note that FIG. 3 is a diagram showing AFM observation after performing crystallization by using heat treatment, irradiating laser light under an atmosphere containing oxygen as a process of introducing oxygen into the film, removing an oxide film on the surface, and then performing leveling by irradiating laser light under a nitrogen atmosphere. On the other hand, FIG. 2 is a diagram showing AFM observation after performing crystallization by using heat treatment, and irradiating laser light under an atmosphere containing oxygen as a process of introducing oxygen into the film, but it is difficult to see domain boundaries. As described above, individual domain boundaries can be confirmed by AFM and SEM by removing an oxide film on the surface, and then irradiating laser light under an inert atmosphere or in a vacuum. Note that, except for making the film surface flat and allowing individual domains to be clearly visualized, the irradiation of laser light under an inert atmosphere or in a vacuum imparts almost no changes to the semiconductor film or to the crystalline state. That is, the size of the domains obtained by the present invention is determined by the processes performed before irradiating the laser light under an inert atmosphere or in a vacuum (such as processes for forming a semiconductor film having an amorphous structure, heat treatment for crystallization, and processes for introducing oxygen).

BRIEF DESCRIPTION OF THE DRAWINGS

In the accompanying drawings:
FIGS. 4A to 4D are views of a manufacturing process of an active matrix substrate;
FIGS. 5A to 5C are views of a manufacturing process of an active matrix substrate.

FIGS. 9A to 9F show examples of electronic equipment;

DETAILED DESCRIPTION OF THE PREFERRED EMBODIMENTS

Embodiment Mode

Embodiment Mode of the Present Invention will be Explained.

An example of manufacturing a semiconductor film having a crystalline structure of the present invention is shown in FIGS. 1A to 1F.

Figure 1A:
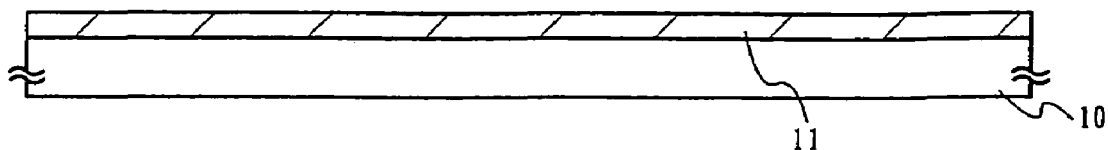
FIGS. 1A to 1F are views of a manufacturing process of the present invention.
Figure 1B:
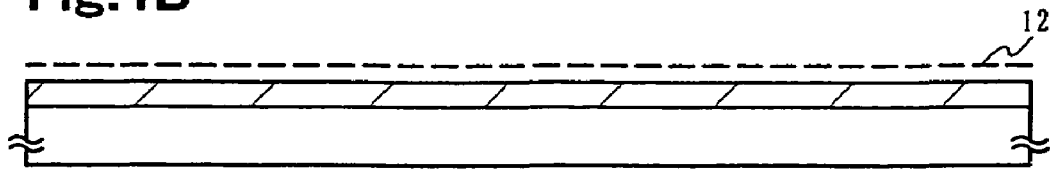

A semiconductor film 11 having an amorphous structure is first formed on a substrate 10 (See FIG. 1A). Glass substrates, quartz substrates, and silicon substrates may be used as the substrate 10, as may metallic substrates and stainless steel substrates having an insulating film formed on the surface thereof. Further, plastic substrates having thermal resistance capable of withstanding processing temperatures may also be used.

Note that a base insulating film may be formed if necessary to prevent impurities from the substrate 10 from diffusing, and the semiconductor film having an amorphous structure may be formed on the base insulating film to prepare the base insulating film. The base film may be formed from an insulating film such as a silicon oxide film, a silicon nitride film, or a silicon oxynitride film. Note that it is preferable to form the base insulating film for cases in which a glass substrate is used.

Further, the semiconductor film 11 having an amorphous structure uses a semiconductor material having silicon as its main constituent. An amorphous silicon film, an amorphous silicon germanium film, or the like is typically applied, and formed to a thickness of 10 to 100 nm by using plasma CVD. Note that it is very important that the concentration of oxygen contained in the semiconductor film 11 having an amorphous structure after film formation be from $1 \times 10^{18}/cm^3$ to $4 \times 10^{18}/cm^3$, approximately $3 \times 10^{18}/cm^3$ (by SIMS measurement).

Crystallization is performed next using a technique disclosed in JP 8-78329 A as a method of crystallizing the semiconductor film having an amorphous structure. The technique recorded in JP 8-78329 is one in which a metallic element which promotes crystallization is selectively added to an amorphous silicon film, and a semiconductor film having a crystalline structure is formed, the crystalline structure spreading out with the regions to which the metallic element is added acting as crystallization origins. First, a nickel acetate solution containing a metallic element (nickel is used here) having a catalytic action for promoting crystallization at 1 to 100 ppm by weight is applied by a spinner, forming a nickel containing layer 12. Means of forming an extremely thin film by sputtering, evaporation, or plasma processing may also be used as other means instead of forming the nickel containing layer 12 by an application method. Further, although the solution is applied over the entire surface with the example shown here, the nickel containing layer 12 may also be formed selectively by using a mask. (See FIG. 1B.)

Figure 1C:
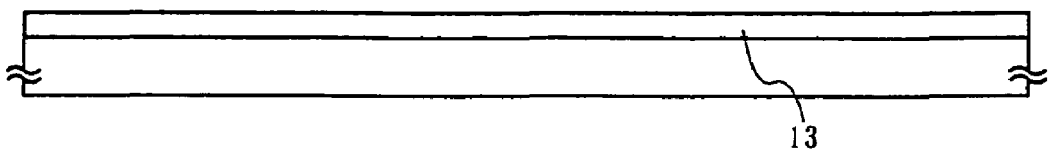
Figure 1D:
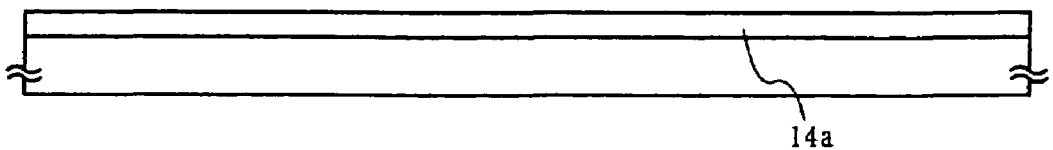
Figure 1E:
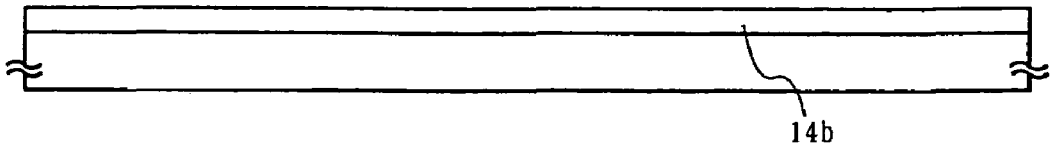

The heat treatment is performed next, thus performing crystallization (See FIG. 1C). In this case, silicides are formed in portions of the semiconductor film contacting the metallic element that promotes crystallization of the semiconductor, and crystallization proceeds with the silicides as nuclei. A semiconductor film 13 having a crystalline structure is thus formed. Note that the concentration of oxygen contained within the semiconductor film 13 nearly does not change before and after crystallization by heat treatment, and it is preferable that this concentration be less than $5 \times 10^{18}/cm^3$. After performing heat treatment for dehydrogenation (at 450° C. for 1 hour), heat treatment is then performed (at 550° C. to 650° C. for 4 to 24 hours) for crystallization. Further, for cases of performing crystallization by the exposure to strong light, it is possible to use infrared light, visible light, ultraviolet light, or a combination of these. Typically, light emitted from a halogen lamp, a metal halide lamp, a xenon arc lamp, a carbon arc lamp, a high voltage sodium lamp, or a high voltage mercury lamp is used. Heat treatment may be performed by turning on the lamp light source for 1 to 60 seconds, preferably for 30 to 60 seconds, and repeating this between one and 10 times, so that the semiconductor film is instantaneously heated to a temperature on the order of 600 to 1000° C. Note that, when necessary, heat treatment for driving out hydrogen contained within the semiconductor film having an amorphous structure may also be performed before the exposure to strong light. Further, crystallization may also be performed by using heat treatment and strong light exposure at the same time. When considering productivity, it is preferable to perform crystallization in a short amount of time by performing exposure to strong light.

The metallic element (nickel here) remains in the semiconductor film 13 having a crystalline structure thus obtained. Even if the metallic element is not distributed uniformly within the film, it remains at an average concentration that exceeds $1 \times 10^{19}/cm^3$. It is of course possible to form all types of semiconductor elements, such as TFTs, in this state, but the metallic element may also be removed using a known gettering method.

Note that, although not shown in the figures, a thin oxide film (including a natural oxide film) is formed on the semiconductor film 13 due to the above heat treatment.

A process of introducing oxygen into the film is performed next after removing the oxide film on the semiconductor film surface by using hydrofluoric acid or the like. (See FIG. 1D.)

As a method of introducing oxygen into the film, an oxide film (not shown in the figures) may be formed on the surface, after which laser light may be irradiated under an inert gas atmosphere or in a vacuum, thus setting the oxygen concentration with a semiconductor film 14a having a crystalline structure from $5 \times 10^{18}/cm^3$ to $10 \times 10^{21}/cm^3$, preferably greater than $2 \times 10^{19}/cm^3$. The oxide film may typically be formed on the surface by using ozone water. Further, ozone may be generated by irradiating ultraviolet light under an oxygen atmosphere, thus oxidizing the surface of the semiconductor film, as another method of forming the oxide film. In addition, an oxide film on the order of 1 to 10 nm may also be deposited by using plasma CVD, sputtering, evaporation, or the like as another method of forming the oxide film.

Alternatively, the oxygen concentration within the film may be set from $5 \times 10^{18}/cm^3$ to $1 \times 10^{21}/cm^3$ by irradiating laser light under an atmosphere containing oxygen or water molecules as another process of introducing oxygen into the semiconductor film.

Alternatively, oxygen may also be added by ion doping or ion implantation such that the concentration of the oxygen within the semiconductor film is from $5\times10^{18}/cm^3$ to $1\times10^{21}/cm^3$, after which laser light irradiation is performed under an inert gas atmosphere or in a vacuum, thus setting the oxygen concentration within the film to $5\times10^{18}/cm^3$ to $1\times10^{21}/cm^3$, as another process for introducing oxygen into the semiconductor film. The concentration of oxygen within the film can be freely set provided that ion doping or ion implantation is used, and damage imparted to the film during the introduction may be repaired later by the laser light.

It is necessary that as little oxygen as possible is contained within the film when crystallizing the semiconductor film having an amorphous structure, but good crystals easily form when there is a lot of oxygen present during laser irradiation, and when using the crystallized film as an active layer of a TFT, high values for the TFT electrical characteristics, such as electric field effect mobility, are seen.

Figure 2:
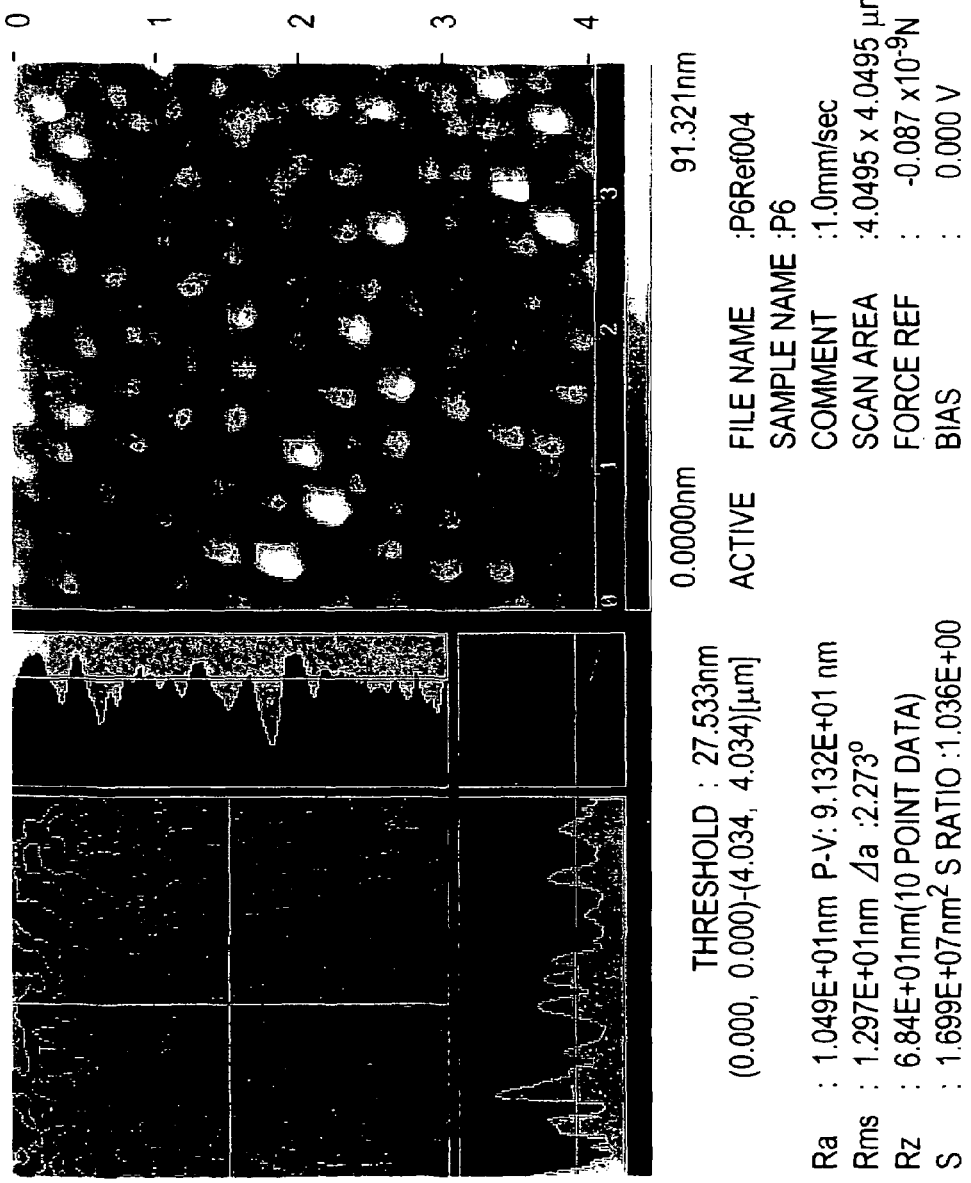
FIG. 2 is an observation view by AFM.

A diagram in which observation by AFM is performed after irradiating laser light ($452.5$ mJ/cm$^2$) under an atmosphere containing oxygen is shown in FIG. 2. With AFM, a 4 $\mu$m by 4 $\mu$m region in which Ra is 10.49 nm, Rms is 12.97 nm, and the P-V value is 91.32 nm is shown. An extremely large roughness is formed by the laser light irradiation, considering that the film thickness of the semiconductor film before laser light irradiation is approximately 50 nm.

Further, the oxide film on the surface is removed before the process of introducing oxygen, but laser light irradiation or the oxygen introducing process may also be performed without removing the oxide film.

A thin oxide film (not shown in the figures here) is formed due to a minute amount of oxygen in a nitrogen atmosphere or in a vacuum when irradiating laser light during the process of introducing oxygen. Furthermore, a natural oxide film (not shown in the figures here) is formed if there is contact with the atmosphere, even for cases in which laser light is not irradiated.

The oxide film on the semiconductor film surface (including the natural oxide film) is next removed by diluted hydrofluoric acid or the like, and a semiconductor film 14b having a crystalline structure is obtained. (See FIG. 1E.)

Figure 1F:
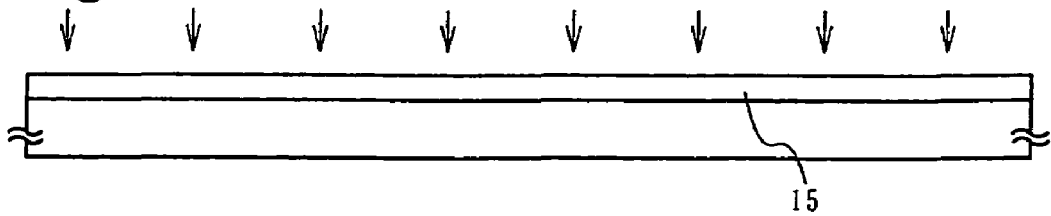

Laser light (430 to 560 mJ/cm$^2$) is then irradiated to the semiconductor film 14b having a crystalline structure under a nitrogen atmosphere or in a vacuum (See FIG. 1F). For cases in which laser light is irradiated in the previous process, which is the process of introducing oxygen, ridges are reduced, that is, the ridges are leveled, if the energy density used in the process of introducing oxygen is set to be less than that of the laser light used in FIG. 1F by 30 to 60 mJ/cm$^2$ (between 400 and 500 mJ/cm$^2$). The value of Ra in the leveled semiconductor film surface can thus be made equal to or less than 2 nm, the value of Rms can be made equal to or less than 2 nm, and the P-V value of the unevenness can be made equal to or less than 50 nm.

Figure 3:
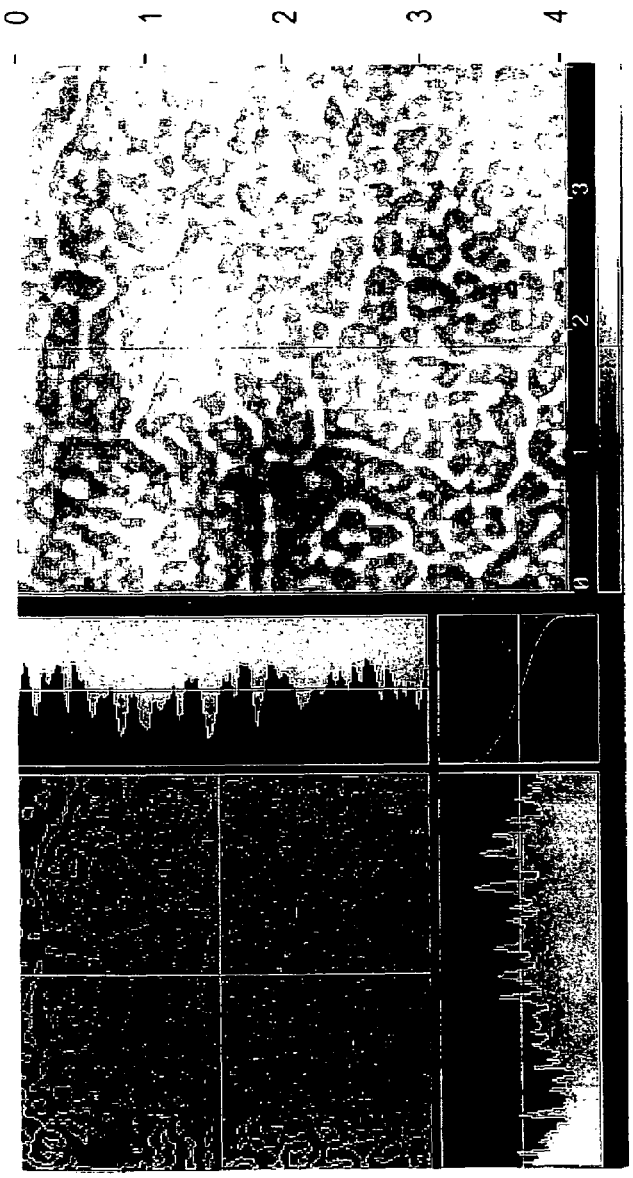
FIG. 3 is an observation view by AFM.

A diagram in which observation by AFM is performed after irradiating laser light (501 mJ/cm$^2$) under an atmosphere containing nitrogen is shown in FIG. 3. With AFM as shown in FIG. 3, data on a 4 $\mu$m by 4 $\mu$m region in which Ra is 2.137 nm, Rms is 2.613 nm, and the P-V value is 20.23 nm is shown.

Further, experimental results are shown in Table 1 for the surface roughness (P-V value, Ra, and Rms) of semiconductor films measured by AFM after a first laser light irradiation, and after a second laser light irradiation, respectively.

TABLE 1

| AFM measurement | P-V value (nm) | | Ra value (nm) | | Rms (nm) | |
|---|---|---|---|---|---|---|
| region (m) | 4 × 4 | 50 × 50 | 4 × 4 | 50 × 50 | 4 × 4 | 50 × 50 |
| After first laser irradiation | 91.32 | 102.38 | 10.49 | 8.32 | 12.97 | 10.21 |
| After second laser irradiation | 20.23 | 36.45 | 2.14 | 1.29 | 2.61 | 1.73 |

Note that, in Table 1, data on a 50 $\mu$m by 50 $\mu$m region in which Ra is 1.29 nm, Rms is 1.73 nm, and the P-V value is 36.45 nm is shown.

A number of rod shape crystal grain aggregates (domains) are formed in a semiconductor film 15 having a crystalline structure thus obtained. All of the crystal grains in a certain crystal grain aggregate (domain) are considered to have the same crystal orientation, and the size of the aggregate of crystal grains (domain) is equal to or greater than approximately 1 $\mu$m, with large aggregates having a size of several tens of micrometers. A TFT having superior TFT characteristics, such as field effect mobility, can be obtained when using the semiconductor film 15 having this crystalline structure as an active layer.

Note that the term "active layer" as used in this specification indicates a semiconductor layer in a TFT having at minimum a channel formation region, a source region, and a drain region.

Further, for comparison, experimental results are shown in Table 2 for the surface roughness (P-V value, Ra, and Rms) of semiconductor films similarly measured by AFM after a first laser light irradiation, and after a second laser light irradiation, respectively, following crystallization by performing heat treatment without the addition of a metallic element.

TABLE 2

| AFM measurement | P-V value (nm) | | Ra value (nm) | | Rms (nm) | |
|---|---|---|---|---|---|---|
| region (m) | 4 × 4 | 50 × 50 | 4 × 4 | 50 × 50 | 4 × 4 | 50 × 50 |
| After first laser irradiation | 79.59 | 81.12 | 11.09 | 8.64 | 13.36 | 10.38 |
| After second laser irradiation | 30.78 | 110.65 | 2.92 | 1.74 | 3.57 | 2.28 |

From Table 1 and Table 2, it can be seen that superior levelness can be obtained after laser light irradiation when crystallization is performed after the addition of a metallic element. In particular, extremely good levelness having a P-V value of 20.23 nm, an Ra of 1.29 nm, and an Rms or 1.73 nm is obtained after the second laser light irradiation. Note that measurement were performed using measurement regions of 4 $\mu$m by 4 $\mu$m, and 50 $\mu$m by 50 $\mu$m. However, the value of P-V after the second laser irradiation in the 50 $\mu$m by 50 $\mu$m region in Table 2 is an anomaly, and cannot be seen as a reliable value.

Further, although it is stated in JP 2001-60551 A that a semiconductor film is leveled by irradiating a second laser light after performing crystallization using a first laser light, there is no mention of increasing levelness by adding a metallic element as above. The present invention is a completely novel invention.

A more detailed explanation of the present invention having the aforementioned structure is given below using embodiments.

EMBODIMENTS

Embodiment 1

An example of the present invention is described with reference to FIGS. 4A to 4D, FIGS. 5A to 5C and FIG. 6. Here, a method of simultaneously manufacturing a pixel portion and TFTs (n-channel TFTs and a p-channel TFT) of a driver circuit provided in the periphery of the pixel portion on the same substrate is described in detail.

First, a base insulating film 101 is formed on a substrate 100, and a first semiconductor film having a crystalline structure is obtained in accordance with the aforementioned Embodiment Modes. Then, the semiconductor film is etched to have a desired shape to form semiconductor layers 102 to 106 separated from one another in an island shape.

A glass substrate (#1737) is used as the substrate 100. For the base insulating film 101, a silicon oxynitride film 101a formed from $SiH_4$, $NH_3$, and $N_2O$ as material gases (composition ratio: Si=32%, O=27%, N=24%, H=17%) is formed with a thickness of 50 nm (preferably 10 to 200 nm) and, at a film deposition temperature of 400° C. by using plasma CVD. Then, after the surface is cleaned with ozone water, an oxide film on the surface is removed by means of dilute hydrofluoric acid (dilution with 1/100). Next, a silicon hydride oxynitride film 101b formed from $SiH_4$ and $N_2O$ as material gases (composition ratio: Si=32%, O=59%, N=7%, H=2%) is formed thereon with a thickness of 100 nm (preferably 50 to 200 nm) and at a film deposition temperature of 400° C. by using plasma CVD to thereby form a lamination. Further, without exposure to an atmosphere, a semiconductor film having an amorphous structure (in this case, amorphous silicon film) is formed to have a thickness of 54 nm (preferably 25 to 80 nm) with $SiH_4$ as a film deposition gas and at a film deposition temperature of 300° C. by using plasma CVD.

Note that it is preferable to have the oxygen concentration of a semiconductor film having an amorphous structure in a range of $1\times10^{18}$ to $4\times10^{18}/cm^3$.

In this embodiment, the base film 101 is shown in a form of a two-layer structure, but a single layer of the insulating film or a structure in which two or more layers thereof are laminated may be adopted. Further, there is no limitation on the material of the semiconductor film. However, the semiconductor film may be preferably formed of silicon or silicon germanium ($Si_XGe_{1-X}$ (X=0.0001 to 0.02)) alloy by using a known means (sputtering, LPCVD, plasma CVD, or the like). Further, a plasma CVD apparatus may be a single wafer type one or a batch type one. In addition, the base insulating film and the semiconductor film may be continuously formed in the same film formation chamber without exposure to an atmosphere.

Subsequently, after the surface of the semiconductor film having an amorphous structure is cleaned, an extremely thin oxide film with a thickness of about 2 nm is formed from ozone water on the surface.

In order to control a threshold value of a TFT, doping (also called channel doping) of a minute amount of impurity element (boron or phosphorous) can be performed. In case of performing doping, for example, an ion doping method is used in which diborane ($B_2H_6$) is plasma-excited without mass-separation, and boron is added to the amorphous silicon film under the doping conditions: an acceleration voltage of 15 kV; a gas flow rate of diborane diluted to 1% with hydrogen of 30 sccm; and a dosage of $2\times10^{12}/cm^2$.

Then, a nickel acetate salt solution containing nickel of 10 ppm in weight is applied using a spinner. Instead of the application, a method of spraying nickel elements to the entire surface by sputtering may also be used. Then, heat treatment is conducted to perform crystallization, thereby forming a semiconductor film having a crystalline structure. A heating process using an electric furnace or irradiation of strong light may be conducted for this heat treatment. In case of the heating process using an electric furnace, it may be conducted at 500 to 650° C. for 4 to 24 hours. Here, after the heating process (500° C. for 1 hour) for dehydrogenation is conducted, the heating process (550° C. for 4 hours) for crystallization is conducted, thereby obtaining a silicon film having a crystalline structure. Note that, although crystallization is performed by using the heating process using a furnace, crystallization may be performed by means of a lamp annealing apparatus. Next, after the oxide film on the surface of the silicon film having a crystalline structure is removed by dilute hydrofluoric acid or the like, a process of introducing oxygen into the film is performed. In Embodiment 1, after forming a thin oxide film (at a thickness of 1–10 nm) with ozone water, laser light (excimer laser light with a repetition frequency of 30 Hz and energy density of 452.5 $mJ/cm^2$) is irradiated in a nitrogen atmosphere. In accordance with the process of introducing oxygen, the oxygen concentration in the semiconductor film which has a crystalline structure is assigned in a range of $5\times10^{18}/cm^3$–$1\times10^{21}/cm^3$, desirably, higher than $2\times10^{19}/cm^3$.

Incidentally, excimer laser light-with a wavelength of 400 nm or less, or second harmonic wave or third harmonic wave of a YAG laser is used for the laser light. In any case, pulse laser light with a repetition frequency of approximately 10 to 1000 Hz is used, the pulse laser light is condensed to 100 to 500 $mJ/cm^2$ by an optical system, and irradiation is performed with an overlap ratio of 90 to 95%, whereby the silicon film surface may be scanned. Excimer laser light is not limited to a pulse oscillation one, a continuous oscillation one also can be used.

Next, after the oxide film formed by the said laser light irradiation is removed by dilute hydrofluoric acid, laser light irradiation is performed again in a nitrogen atmosphere or in a vacuum, thereby leveling the semiconductor film surface. In Embodiment 1, laser light (excimer laser light with a repetition frequency of 30 Hz and energy density of 501 $mJ/cm^2$) is irradiated in a nitrogen atmosphere. By measuring the leveled semiconductor film surface through AFM, Ra becomes 2 nm or less, Rms becomes 2 nm or less, and P-V value of unevenness becomes 50 nm or less.

Next, the surface is processed with ozone water for 120 seconds, thereby forming a barrier layer comprised of an oxide film with a thickness of 1 to 5 nm in total.

Then, an amorphous silicon film containing an argon element, which becomes a gettering site, is formed on the barrier layer to have a thickness of 150 nm by sputtering. The film deposition conditions with sputtering in this embodiment are: a film deposition pressure of 0.3 Pa; a gas (Ar) flow rate of 50 sccm; a film deposition power of 3 kW; and a substrate temperature of 150° C. Note that under the above conditions, the atomic concentration Of the argon element contained in the amorphous silicon film is $3\times10^{20}/cm^3$ to $6\times10^{20}/cm^3$, and the atomic concentration of oxygen is $1\times10^{19}/cm^3$ to $3\times10^{19}/cm^3$. Thereafter, heat treatment at 650° C. for 3 minutes is conducted using the lamp annealing apparatus to perform gettering.

Subsequently, the amorphous silicon film containing the argon element, which is the gettering site, is selectively removed with the barrier layer as an etching stopper, and then, the barrier layer is selectively removed by dilute hydrofluoric acid. Note that there is a tendency that nickel is likely to move to a region with a high oxygen concentration in gettering, and thus, it is desirable that the barrier layer comprised of the oxide film is removed after gettering.

Moreover, although an example, in which the semiconductor film containing argon is made as a gettering site and thereby the gettering is performed, is shown, in place of the semiconductor film containing argon, the semiconductor film containing phosphorus or boron may also be used. Further, other gettering methods may be used, a gettering site is formed by doping phosphorus or boron alternatively, thereby performing a gettering by conducting a heating treatment, and a gettering may be performed by conducting a heating treatment in halogen gas atmosphere.

Then, after a thin oxide film is formed from ozone water on the surface of the obtained silicon film having a crystalline structure (also referred to as polysilicon film), a mask made of resist is formed, and an etching process is conducted thereto to obtain a desired shape, thereby forming the island-like semiconductor layers 102 to 106 separated from one another. After the formation of the semiconductor layers, the mask made of resist is removed.

Then, the oxide film is removed with the etchant containing hydrofluoric acid, and at the same time, the surface of the silicon film is cleaned. Thereafter, an insulating film containing silicon as its main constituent, which becomes a gate insulating film 107, is formed. In this embodiment, a silicon oxynitride film (composition ratio: Si=32%, O=59%, N=7%, H=2%) is formed with a thickness of 115 nm by plasma CVD.

Next, as shown in FIG. 4A, on the gate insulating film 107, a first conductive film 108a with a thickness of 20 to 100 nm and a second conductive film 108b with a thickness of 100 to 400 nm are formed in lamination. In this embodiment, a 50 nm thick tantalum nitride film and a 370 nm thick tungsten film are sequentially laminated on the gate insulating film 107.

As a conductive material for forming the first conductive film and the second conductive film, an element selected from the group consisting of Ta, W, Ti, Mo, Al and Cu, or an alloy material or compound material containing the above element as its main constituent is employed. Further, a semiconductor film typified by a polycrystalline silicon film doped with an impurity element such as phosphorous, or an AgPdCu alloy may be used as the first conductive film and the second conductive film. Further, the present invention is not limited to a two-layer structure. For example, a three-layer structure may be adopted in which a 50 nm thick tungsten film, an alloy film of aluminum and silicon (Al—Si) with a thickness of 500 nm, and a 30 nm thick titanium nitride film are sequentially laminated. Moreover, in case of a three-layer structure, tungsten nitride may be used in place of tungsten of the first conductive film, an alloy film of aluminum and titanium (Al—Ti) may be used in place of the alloy film of aluminum and silicon (Al—Si) of the second conductive film, and a titanium film may be used in place of the titanium nitride film of the third conductive film. In addition, a single layer structure may also be adopted.

Next, as shown in FIG. 4B, masks 110 to 115 are formed by an exposure step, and a first etching process for forming gate electrodes and wirings is performed. The first etching process is performed with first and second etching conditions. An ICP (inductively coupled plasma) etching method may be preferably used for the etching process. The ICP etching method is used, and the etching conditions (an electric energy applied to a coil-shape electrode, an electric energy applied to an electrode on a substrate side, a temperature of the electrode on the substrate side, and the like) are appropriately adjusted, whereby a film can be etched to have a desired taper shape. Note that chlorine-based gases typified by $Cl_2$, $BCl_3$, $SiCl_4$, and $CCl_4$, fluorine-based gases typified by $CF_4$, $SF_6$, and $NF_3$, and $O_2$ can be appropriately used as etching gases.

In this embodiment, RF (13.56 MHz) power of 150 W is applied also to the substrate (sample stage) to substantially apply a negative self-bias voltage. With the first etching conditions, a W film is etched to form an end portion of the first conductive layer into a tapered shape. Under the first etching conditions, an etching rate to W is 200.39 nm/min, an etching rate to TaN is 80.32 nm/min, and a selection ratio of W to TaN is about 2.5. Further, with the first etching conditions, a taper angle of W is approximately 26° Thereafter, the first etching conditions are changed to the second etching conditions without removing the masks 110 to 115 made of resist. $CF_4$ and $Cl_2$ are used as etching gases, the flow rate of the gases is set to 30/30 sccm, and RF (13.56 MHz) power of 500 W is applied to a coil-shape electrode with a pressure of 1 Pa to generate plasma, thereby performing etching for about 30 seconds. RF (13.56 MHz) power of 20 W is also applied to the substrate side (sample stage) to substantially apply a negative self-bias voltage. Under the second etching conditions in which $CF_4$ and $Cl_2$ are mixed, both the W film and the TaN film are etched at the same level. With the second etching conditions, an etching rate to W is 58.97 nm/min, and an etching rate to TaN is 66.43 nm/min. Note that an etching time may be increased by 10 to 20% in order to conduct etching without remaining residue on the gate insulating film.

In the first etching process as described above, the shape of the mask made of resist is made appropriate, whereby the end portion of the first conductive layer and the end portion of the second conductive layer each have a tapered shape due to the effect of the bias voltage applied to the substrate side. The angle of the tapered portion is sufficiently set to 15 to 45°.

Thus, first shape conductive layers 117 to 121 composed of the first conductive layer and the second conductive layer (first conductive layers 117a to 122a and second conductive layers 117b to 122b) are formed by the first etching process. The insulating film 107 that becomes the gate insulating film is etched by approximately 10 to 20 nm, and becomes a gate insulating film 116 in which regions which are not covered by the first shape conductive layers 117 to 121 are thinned.

Next, a second etching process is conducted without removing the masks made of resist. Here, $SF_6$, $Cl_2$ and $O_2$ are used as etching gases, the flow rate of the gases is set to 24/12/24 sccm, and RF (13.56 MHz) power of 700 W is applied to a coil-shape electrode with a pressure of 1.3 Pa to generate plasma, thereby performing etching for 25 seconds. RF (13.56 MHz) power of 10 W is also applied to the substrate side (sample stage) to substantially apply a negative self-bias voltage. In the second etching process, an etching rate to W is 227.3 nm/min, an etching rate to TaN is 32.1 nm/min, a selection ratio of W to TaN is 7.1, an etching rate to SiON that is the insulating film 116 is 33.7 nm/min, and a selection ratio of W to SiON is 6.83. In the case where $SF_6$ is used as the etching gas, the selection ratio with respect to the insulating film 116 is high as described above. Thus, reduction in the film thickness can be suppressed. In this embodiment, the film thickness of the insulating film 116 is reduced by only about 8 nm.

By the second etching process, the taper angle of W becomes 70°. By the second etching process, second conductive layers 124b to 129b are formed. On the other hand, the first conductive layers are hardly etched to become first conductive layers 124a to 129a. Note that the first conductive layers 124a to 129a have substantially the same size as the first conductive layers 117a to 121a. In actuality, the width of the first conductive layer may be reduced by approximately 0.3 μm, namely, approximately 0.6 μm in the total line width in comparison with before the second etching process. However, there is almost no change in size of the first conductive layer.

Further, in the case where, instead of the two-layer structure, the three-layer structure is adopted in which a 50 nm thick tungsten film, an alloy film of aluminum and silicon (Al—Si) with a thickness of 500 nm, and a 30 nm thick titanium nitride film are sequentially laminated, under the first etching conditions of the first etching process in which: $BCl_3$, $Cl_2$ and $O_2$ are used as material gases; the flow rate of the gases is set to 65/10/5 (sccm); RF (13.56 MHz) power of 300 W is applied to the substrate side (sample stage); and RF (13.56 MHz) power of 450 W is applied to a coil-shape electrode with a pressure of 1.2 Pa to generate plasma, etching is performed for 117 seconds. As to the second etching conditions of the first etching process, $CF_4$, $Cl_2$ and $O_2$ are used, the flow rate of the gases is set to 25/25/10 sccm, RF (13.56 MHz) power of 20 W is also applied to the substrate side (sample stage); and RF (13.56 MHz) power of 500 W is applied to a coil-shape electrode with a pressure of 1 Pa to generate plasma. With the above conditions, it is sufficient that etching is performed for about 30 seconds. In the second etching process, $BCl_3$ and $Cl_2$ are used, the flow rate of the gases are set to 20/60 sccm, RF (13.56 MHz) power of 100 W is applied to the substrate side (sample stage), and RF (13.56 MHz) power of 600 W is applied to a coil-shape electrode with a pressure of 1.2 Pa to generate plasma, thereby performing etching.

Next, the masks made of resist are removed, and then, a first doping process is conducted to obtain the state of FIG. 4D. The doping process may be conducted by ion doping or ion implantation. Ion doping is conducted with the conditions of a dosage of $1.5 \times 10^{14}$ atoms/cm$^2$ and an accelerating voltage of 60 to 100 keV. As an impurity element imparting n-type conductivity, phosphorous (P) or arsenic (As) is typically used. In this case, first conductive layers and second conductive layers 124 to 128 become masks against the impurity element imparting n-type conductivity, and first impurity regions 1130 to 134 are formed in a self-aligning manner. The impurity element imparting n-type conductivity is added to the first impurity regions 130 to 134 in a concentration range of $1 \times 10^{16}$ to $1 \times 10^{17}$/cm$^3$. Here, the region having the same concentration range as the first impurity region is also called an n$^{--}$ region.

Note that although the first doping process is performed after the removal of the masks made of resist in this embodiment, the first doping process may be performed without removing the masks made of resist.

Subsequently, as shown in FIG. 5A, masks 135 to 137 made of resist are formed, and a second doping process is conducted. The mask 135 is a mask for protecting a channel forming region and a periphery thereof of a semiconductor layer forming a p-channel TFT of a driver circuit, the mask 136 is a mask for protecting a channel forming region and a periphery thereof of a semiconductor layer forming one of n-channel TFTs of the driver circuit, and the mask 137 is a mask for protecting a channel forming region, a periphery thereof, and a storage capacitor of a semiconductor layer forming a TFT of a pixel portion.

With the ion doping conditions in the second doping process: a dosage of $1.5 \times 10^{15}$ atoms/cm$^2$; and an accelerating voltage of 60 to 100 keV, phosphorous (P) is doped. Here, impurity regions are formed in the respective semiconductor layers in a self-aligning manner with the second conductive layer 124b as masks. Of course, phosphorous is not added to the regions covered by the masks 135 to 137. Thus, second impurity regions 138 to 140 and a third impurity region 142 are formed. The impurity element imparting n-type conductivity is added to the second impurity regions 138 to 140 in a concentration range of $1 \times 10^{20}$ to $1 \times 10^{21}$/cm$^3$. Here, the region having the same concentration range as the second impurity region is also called an n$^+$ region.

Further, the third impurity region is formed at a lower concentration than that in the second impurity region by the first conductive layer, and is added with the impurity element imparting n-type conductivity in a concentration range of $1 \times 10^{18}$ to $1 \times 10^{19}$/cm$^3$. Note that since doping is conducted by passing the portion of the first conductive layer having a tapered shape, the third impurity region has a concentration gradient in which an impurity concentration increases toward the end portion of the tapered portion. Here, the region having the same concentration range as the third impurity region is called an n$^-$ region. Furthermore, the regions covered by the masks 136 and 137 are not added with the impurity element in the second doping process, and become first impurity regions 144 and 145.

Next, after the masks 135 to 137 made of resist are removed, masks 146 to 148 made of resist are newly formed, and a third doping process is conducted as shown in FIG. 5B.

In the driver circuit, by the third doping process as described above, fourth impurity regions 149, 150 and fifth impurity regions 151, 152 are formed in which an impurity element imparting p-type conductivity is added to the semiconductor layer forming the p-channel TFT and to the semiconductor layer forming the storage capacitor.

Further, the impurity element imparting p-type conductivity is added to the fourth impurity regions 149 and 150 in a concentration range of $1 \times 10^{20}$ to $1 \times 10^{21}$/cm$^3$. Note that, in the fourth impurity regions 149, 150, phosphorous (P) has been added in the preceding step (n$^-$ region), but the impurity element imparting p-type conductivity is added at a concentration that is 1.5 to 3 times as high as that of phosphorous. Thus, the fourth impurity regions 149, 150 have a p-type conductivity. Here, the region having the same concentration range as the fourth impurity region is also called a p$^+$ region.

Further, fifth impurity regions 151 and 152 are formed in regions overlapping the tapered portion of the second conductive layer 125a, and are added with the impurity element imparting p-type conductivity in a concentration range of $1 \times 10^{18}$ to $1 \times 10^{20}$/cm$^3$. Here, the region having the same concentration range as the fifth impurity region is also called a p$^-$ region.

Through the above-described steps, the impurity regions having n-type or p-type conductivity are formed in the respective semiconductor layers. The conductive layers 124 to 127 become gate electrodes of a TFT. Further, the conductive layer 128 becomes one of electrodes, which forms the storage capacitor in the pixel portion. Moreover, the conductive layer 129 forms a source wiring in the pixel portion.

Next, an insulating film (not shown) that covers substantially the entire surface is formed. In this embodiment, a 50 nm thick silicon oxide film is formed by plasma CVD. Of course, the insulating film is not limited to a silicon oxide film, and other insulating films containing silicon may be used in a single layer or a lamination structure.

Then, a step of activating the impurity element added to the respective semiconductor layers is conducted. In this activation step, a rapid thermal annealing (RTA) method using a lamp light source, a method of irradiating light emitted from a YAG laser or excimer laser from the back surface, heat treatment using a furnace, or a combination thereof is employed.

Further, although an example in which the insulating film is formed before the activation is shown in this embodiment, a step of forming the insulating film may be conducted after the activation is conducted.

Next, a first interlayer insulating film 153 is formed of a silicon nitride film, and heat treatment (300 to 550° C. for 1 to 12 hours) is performed, thereby conducting a step of hydrogenating the semiconductor layers. (FIG. 5C) This step is a step of terminating dangling bonds of the semiconductor layers by hydrogen contained in the first interlayer insulating film 153. The semiconductor layers can be hydrogenated irrespective of the existence of an insulating film (not shown) formed of a silicon oxide film. Incidentally, in this embodiment, a material containing aluminum as its main constituent is used for the second conductive layer, and thus, it is important to apply the heating process condition that the second conductive layer can withstand in the step of hydrogenation. As another means for hydrogenation, plasma hydrogenation (using hydrogen excited by plasma) may be conducted.

Next, a second interlayer insulating film 154 is formed from an organic insulating material on the first interlayer insulating film 153. In this embodiment, an acrylic resin film with a thickness of 1.6 $\mu$m is formed. Then, a contact hole that reaches the source wiring 129, contact holes that respectively reach the conductive layers 127 and 128, and contact holes that reach the respective impurity regions are formed. In this embodiment, a plurality of etching processes are sequentially performed. In this embodiment, the second interlayer insluting film is etched with the first interlayer insulating film as the etching stopper, the first interlayer insulating film is etched with the insulating film (not shown) as the etching stopper, and then, the insulating film (not shown) is etched.

Thereafter, wirings and pixel electrode are formed by using Al, Ti, Mo, W and the like. As the material of the electrodes and pixel electrode, it is desirable to use a material excellent in reflecting property, such as a film containing Al or Ag as its main constituent or a lamination film of the above film. Thus, source electrodes or drain electrodes 155 to 160, a gate wiring 162, a connection wiring 161, and a pixel electrode 163 are formed.

As described above, a driver circuit 206 having an n-channel TFT 201, a p-channel TFT 202, and an n-channel TFT 203 and a pixel portion 207 having a pixel TFT 204 comprised of an n-channel TFT and a storage capacitor 205 can be formed on the same substrate. (FIG. 6) In this specification, the above substrate is called an active matrix substrate for the sake of convenience. In the pixel portion 207, the pixel TFT 204 (n-channel TFT); has a channel forming region 167, the first impurity region (n⁻ region) 145 formed outside the conductive layer 127 forming the gate electrode, and the second impurity region (n⁺ region) 140 functioning as a source region. Further, in the semiconductor layer functioning as one of electrodes of the storage capacitor 205, the fourth impurity region 150 and the fifth impurity region 152 are formed. Note that the semiconductor layer surface functioning as one of electrodes of the storage capacitor 205 is leveled, concretely, the leak current can be reduced and reliability can be improved by setting Ra to 2 nm or less, Rms to 2 nm or less, and P-V value of unevenness to 50 nm or less. The storage capacitor 205 is constituted of the second electrode 128 and the semiconductor layers 150, 152, and 168 with the insulating film (the same film as the gate insulating film) 116 as dielectric.

Further, in the driver circuit 206, the n-channel TFT 201 (first n-channel TFT) has a channel forming region 164, the third impurity region (n region) 142 that overlaps a part of the conductive layer 124 forming the gate electrode through the insulating film, and the second impurity region (n⁺ region) 138 functioning as a source region or a drain region.

Further, in the driver circuit 206, the p-channel TFT 202 has a channel forming region 165, the fifth impurity region (p⁻ region) 151 that overlaps a part of the conductive layer 125 forming the gate electrode through the insulating film, and the fourth impurity region (p⁺ region) 149 functioning as a source region or a drain region.

Furthermore, in the driver circuit 206, the n-channel TFT 203 (second n-channel TFT) has a channel forming region 166, the first impurity region (n⁻ region) 144 outside the conductive layer 126 forming the gate electrode, and the second impurity region (n⁺ region) 139 functioning as a source region or a drain region.

The above TFTs 201 to 203 are appropriately combined to form a shift register circuit, a buffer circuit, a level shifter circuit, a latch circuit and the like, thereby forming the driver circuit 206. For example, in the case where a CMOS circuit is formed, the n-channel TFT 201 and the p-channel TFT 202 may be complementarily connected to each other.

In particular, the structure of the n-channel TFT 203 is appropriate for the buffer circuit having a high driving voltage with the purpose of preventing deterioration due to a hot carrier effect.

Moreover, the structure of the n-channel TFT 201, which is a GOLD structure, is appropriate for the circuit in which the reliability takes top priority. Further, an example of manufacturing the active matrix substrate for forming a reflection type display device is shown in this embodiment. However, if the pixel electrode is formed of a transparent conductive film, a transmission type display device can be formed although the number of photomasks is increased by one.

Note that, in this specification, the "electrode" is a part of the "wiring" and indicates a point where electrical connection is made with another wiring or a point where the wiring intersects with the semiconductor layer. Therefore, for the sake of convenience of the description, the "wiring" and the "electrode" are separately used. However, the "wiring" is always included in the term "electrode".

Embodiment 2

This embodiment describes a process of manufacturing an active matrix liquid crystal display device from the active matrix substrate fabricated in Embodiment 1. The description is given with reference to FIG. 7.

Figure 6:
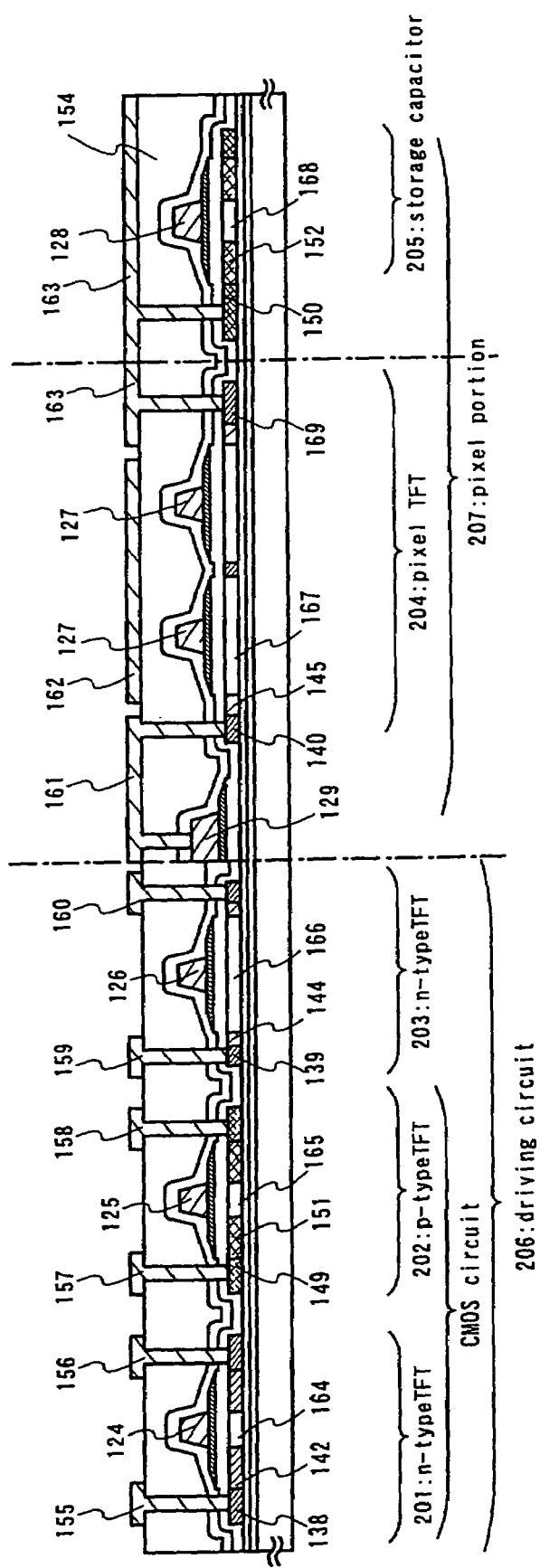
FIG. 6 is a view of an active matrix substrate.

After the active matrix substrate as illustrated in FIG. 6 is obtained in accordance with Embodiment 1, an alignment layer is formed on the active matrix substrate of FIG. 6 and subjected to rubbing treatment. In this embodiment, before the alignment layer is formed, an organic resin film such as an acrylic resin film is patterned to form columnar spacers in desired positions in order to keep the substrates apart. The columnar spacers may be replaced by spherical spacers sprayed onto the entire surface of the substrate.

A counter substrate is prepared next. The counter substrate has a color filter in which colored layers and light-shielding layers are arranged with respect to the pixels. A light-shielding layer is also placed in the driving circuit portion. A planarization film is formed to cover the color filter and the light-shielding layer. On the planarization film, an opposite electrode is formed from a transparent conductive film in the pixel portion. An alignment layer is formed over the entire surface of the counter substrate and is subjected to rubbing treatment.

Then the counter substrate is bonded to the active matrix substrate on which the pixel portion and the driving circuits are formed, using a sealing member. The sealing member has filler mixed therein and the filler, together with the columnar spacers, keeps the distance between the two substrates while they are bonded. Thereafter a liquid crystal material is injected between the substrates and an encapsulant (not shown) is used to completely seal the substrates. A known liquid crystal material can be used. The active matrix liquid crystal display device is thus completed. If necessary, the active matrix substrate or the counter substrate is cut into pieces of desired shapes. The display device may be appropriately provided with a polarizing plate using a known technology. Then FPCs are attached to the substrate using a known technology.

Figure 7:
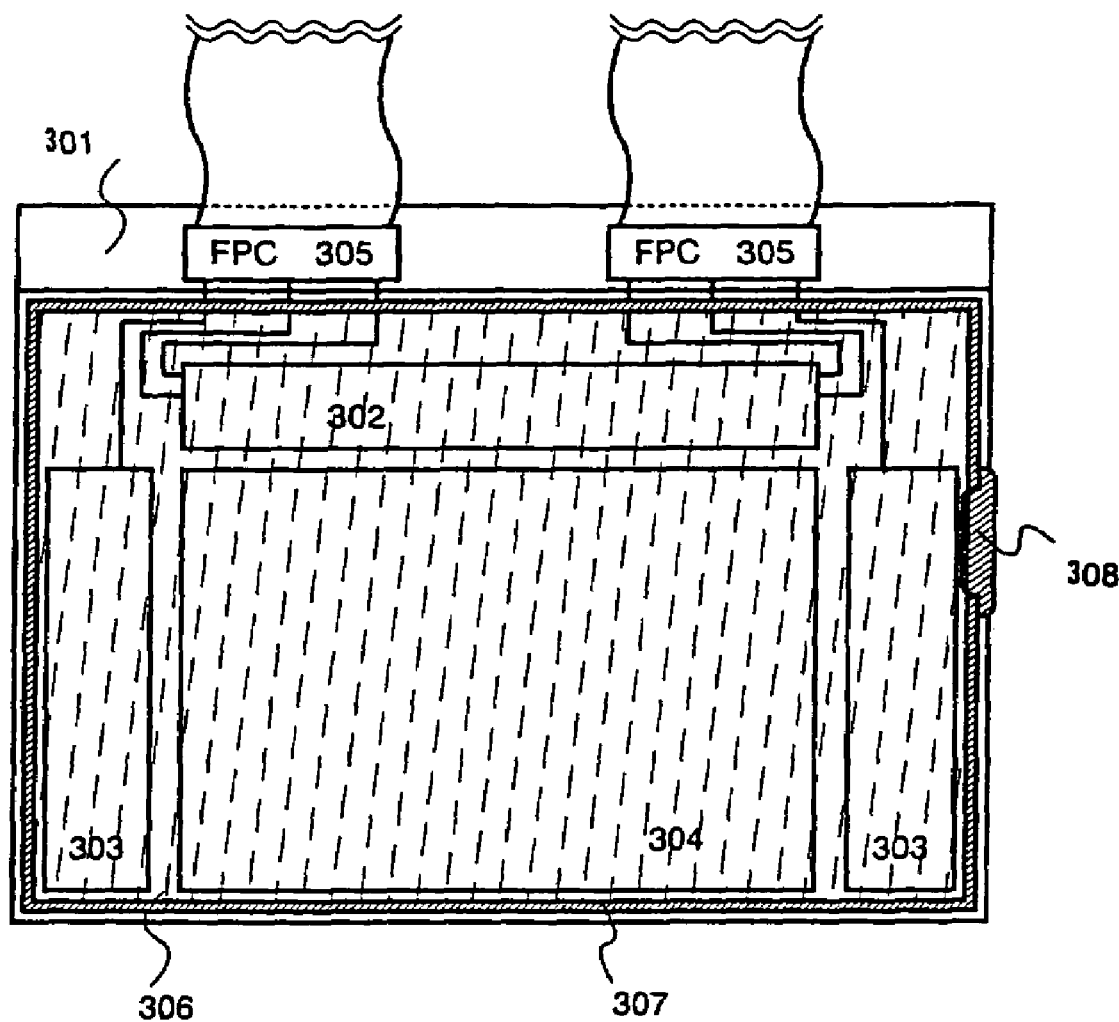
FIG. 7 is a view of an outer appearance of an AM-LCD; (Embodiment 2)

The structure of the thus obtained liquid crystal module is described with reference to the top view in FIG. 7.

A pixel portion 304 is placed in the center of an active matrix substrate 301. A source signal line driving circuit 302 for driving source signal lines is positioned above the pixel portion 304. Gate signal line driving circuits 303 for driving gate signal lines are placed to the left and right of the pixel portion 304. Although the gate signal line driving circuits 303 are symmetrical with respect to the pixel portion in this embodiment, the liquid crystal module may have only one gate signal line driving circuit on one side of the pixel portion. Of the above two options, a designer can choose the arrangement that suits better considering the substrate size or the like of the liquid crystal module. However, the symmetrical arrangement of the gate signal line driving circuits shown in FIG. 7 is preferred in terms of circuit operation reliability, driving efficiency, and the like.

Signals are inputted to the driving circuits from flexible printed circuits (FPC) 305. The FPCs 305 are press-fit through an anisotropic conductive film or the like after opening contact holes in the interlayer insulating film and resin film and forming a connection electrode 309 so as to reach the wiring lines arranged in given places of the substrate 301. The connection electrode is formed from ITO in this embodiment.

A sealing agent 307 is applied to the substrate along its perimeter surrounding the driving circuits and the pixel portion. An counter substrate 306 is bonded to the substrate 301 by the sealing agent 307 while a spacer 310 formed in advance on the active matrix substrate keeps the distance between the two substrates constant (the distance between the substrate 301 and the counter substrate 306). A liquid crystal element is injected through an area of the substrate that is not coated with the sealing agent 307. The substrates are then sealed by an encapsulant 308. The liquid crystal module is completed through the above steps.

Although all of the driving circuits are formed on the substrate in the example shown here, several ICs may be used for some of the driving circuits.

Embodiment 3

Embodiment 1 shows an example of reflective display device in which a pixel electrode is formed from a reflective metal material. Shown in this embodiment is an example of transmissive display device in which a pixel electrode is formed from a light-transmitting conductive film.

The manufacture process up through the step of forming an interlayer insulating film is identical with the process of Embodiment 1, and the description thereof is omitted here. After the interlayer insulating film is formed in accordance with Embodiment 1, a pixel electrode 601 is formed from a light-transmitting conductive film. Examples of the light-transmitting conductive film include an ITO (indium tin oxide alloy) film, an indium oxide-zinc oxide alloy ($In_2O_3$-ZnO) film, a zinc oxide (ZnO) film, and the like.

Thereafter, contact holes are formed in an interlayer insulating film 600. A connection electrode 602 overlapping the pixel electrode is formed next. The connection electrode 602 is connected to a drain region through the contact hole. At the same time the connection electrode is formed, source electrodes or drain electrodes of other TFTs are formed.

Although all of the driving circuits are formed on the substrate in the example shown here, several ICs may be used for some of the driving circuits.

Figure 8:
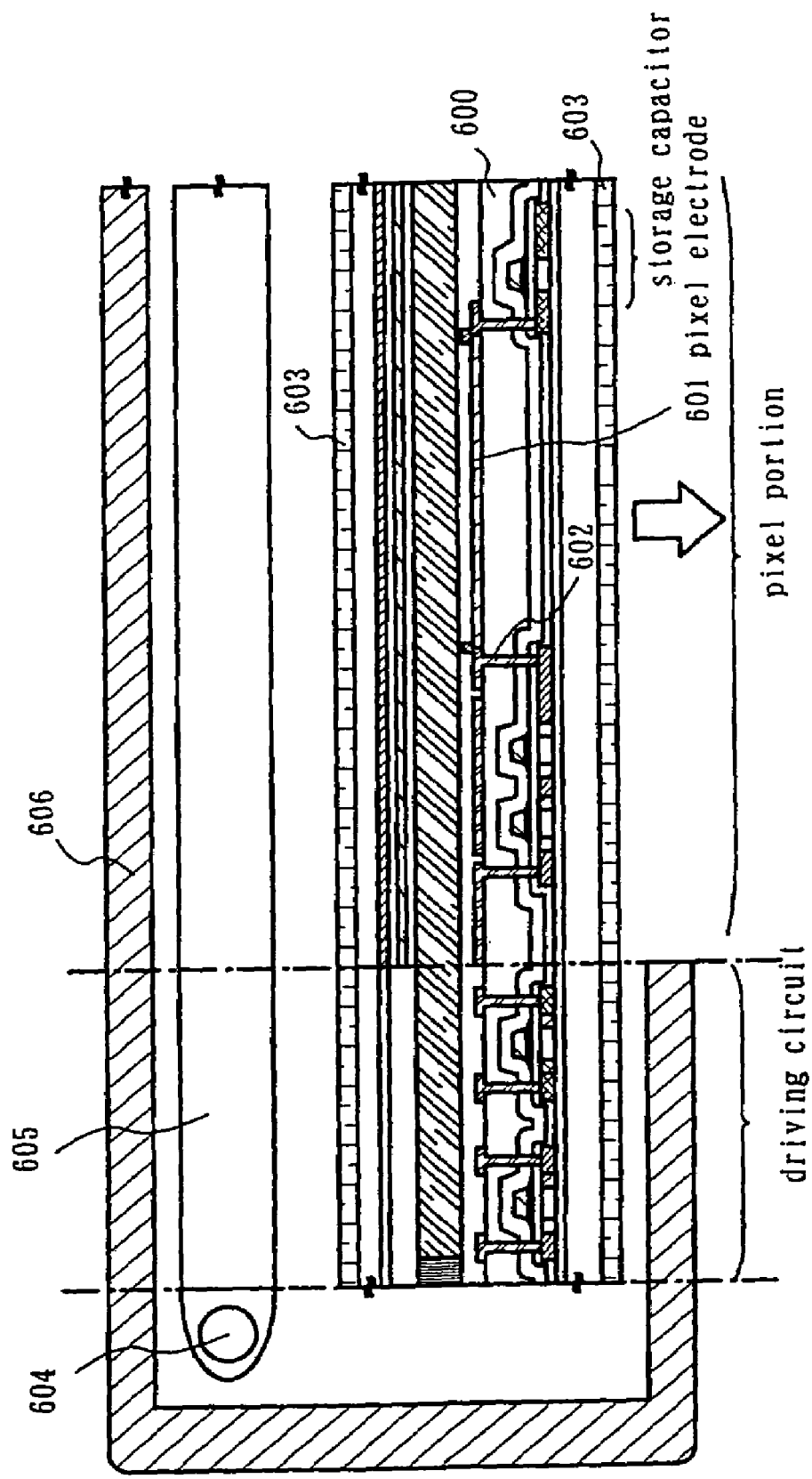
FIG. 8 is a view of an example of a sectional view of a liquid crystal display device; (Embodiment 3)

An active matrix substrate is completed as above. A liquid crystal module is manufactured from this active matrix substrate in accordance with Embodiment 2. The liquid crystal module is provided with a backlight 604 and a light guiding plate 605, and is covered with a cover 606 to complete the active matrix liquid crystal display device of which a partial sectional view is shown in FIG. 8. The cover is bonded to the liquid crystal module using an adhesive or an organic resin. When bonding the substrate to the counter substrate, the substrates may be framed so that the space between the frame and the substrates is filled with an organic resin for bonding. Since the display device is of transmissive type, the active matrix substrate and the counter substrate each needs a polarizing plate 603 to be bonded.

Embodiment 4

Various modules (active matrix type liquid crystal module and active matrix type EC module) can be completed by the driver circuit and the pixel portion formed by implementing the present invention. That is, all of electronic equipments integrated with the modules thereof can be completed.

As such electronic equipment, there are pointed out a video camera, a digital camera, a head mount display (goggle type display), a car navigation system, a projector, a car stereo, a personal computer, a portable information terminal (mobile computer, cellular phone or electronic book) and the like. Examples of these are shown in FIGS. 9 to 11.

FIG. 9A shows a personal computer including a main body 2001, an image input portion 2002, a display portion 2003 and a keyboard 2004.

FIG. 9B shows a video camera including a main body 2101, a display-portion 2102, a voice input portion 2103, operation switches 2104, a battery 2105 and an image receiving portion 2106.

FIG. 9C shows a mobile computer including a main body 2201, a camera portion 2202, an image receiving portion 2203, an operation switch 2204 and a display portion 2205.

FIG. 9D shows a goggle type display including a main body 2301, a display portion 2302 and an arm portion 2303.

FIG. 9E shows a player using a record medium recorded with programs (hereinafter, referred to as record medium) including a main body 2401, a display portion 2402, a speaker portion 2403, a record medium 2404 and an operation switch 2405. The player uses DVD (digital Versatile Disc) or CD as the record medium and can enjoy music, enjoy movie and carry out game or Internet.

FIG. 9F shows a digital camera including a main body 2501, a display portion 2502, an eye contact portion 2503, operation switches 2504 and an image receiving portion (not illustrated).

Figure 10A:
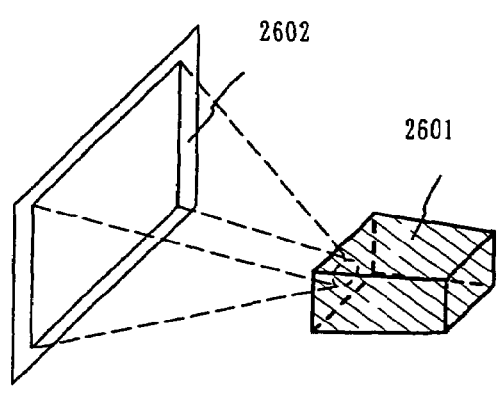
FIGS. 10A to 10D show examples of electronic equipment.

FIG. 10A shows a front type projector including a projection equipment 2601 and a screen 2602. Embodiment 3 can be applied to the liquid crystal module 2808 forming a part of the projection equipment 2601, and the general device can be completed then.

Figure 10B:
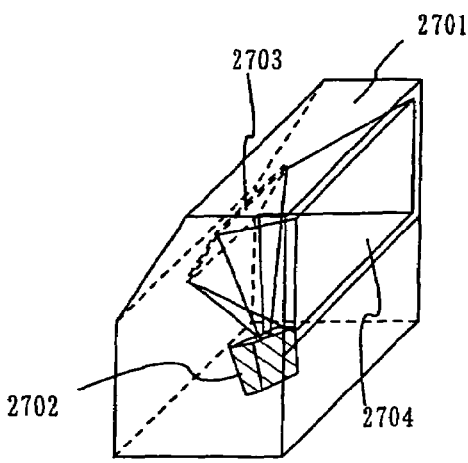

FIG. 10B shows a rear type projector including a main body 2701, a projection equipment 2702, a mirror 2703 and a screen 2704. Embodiment 3 can be applied to the liquid crystal module 2808 forming a part of the projection equipment 2702, and the general device can be completed then.

Figure 10C:
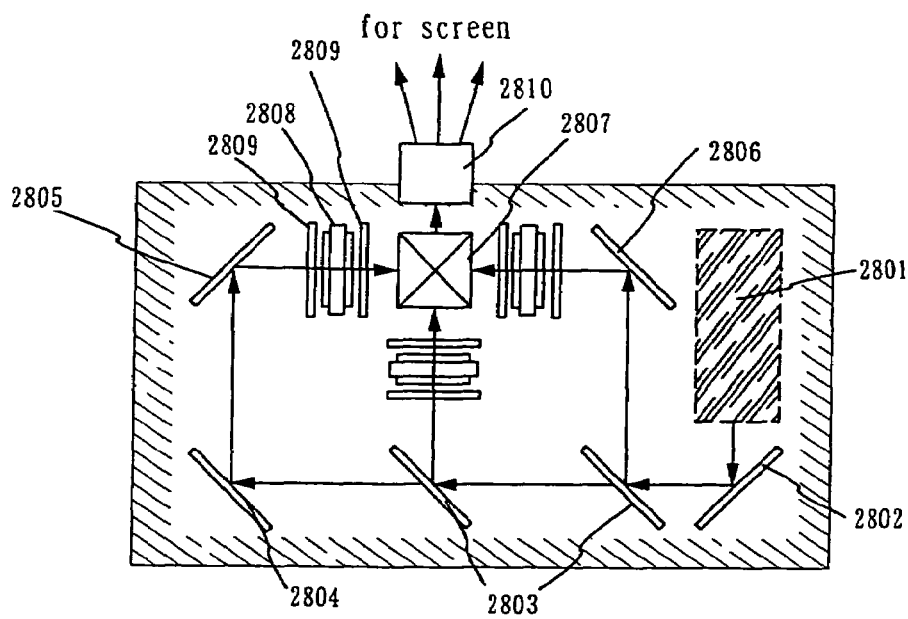

Further, FIG. 10C is a view showing an example of a structure of the projection equipment 2601 and 2702 in FIG. 10A and FIG. 10B. The projection equipment 2601 or 2702 is constituted by a light source optical system 2801, mirrors 2802, and 2804 through 2806, a dichroic mirror 2803, a prism 2807, a liquid crystal display equipment 2808, a phase difference plate 2809 and a projection optical system 2810. The projection optical system 2810 is constituted by an optical system including a projection lens. Although this embodiment shows an example of three plates type, this embodiment is not particularly limited thereto but may be of, for example, a single plate type. Further, person of executing this embodiment may pertinently provide an optical system such as an optical lens, a film having a polarization function, a film for adjusting a phase difference or an IR film in an optical path shown by arrow marks in FIG. 10C.

Figure 10D:
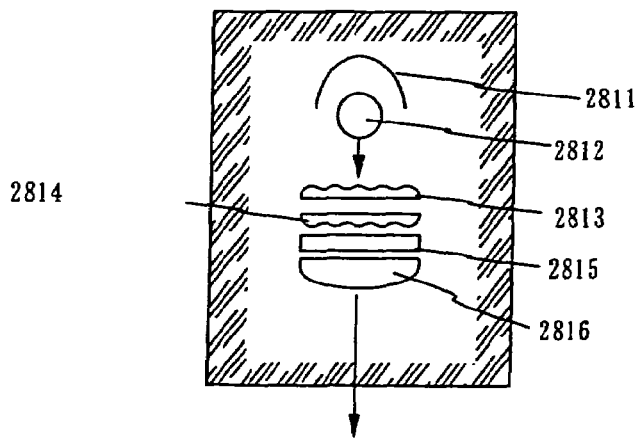

Further, FIG. 10D is a view showing an example of a structure of the light source optical system 2801 in FIG. 10C. According to this embodiment, the light source optical system 2801 is constituted by a reflector 2811, a light source 2812, lens arrays 2813 and 2814, a polarization conversion element 2815 and a focusing lens 2816. Further, the light source optical system shown in FIG. 10D is only an example and this example is not particularly limited thereto. For example, a person of executing this embodiment may pertinently provide an optical system such as an optical lens, a film having a polarization function, a film for adjusting a phase difference or an IR film in the light source optical system. However, according to the projectors shown in FIG. 10, there is shown a case of using a transmission type electro-optical device and an example of applying a reflection type electro-optical device is not illustrated.

Figure 11A:
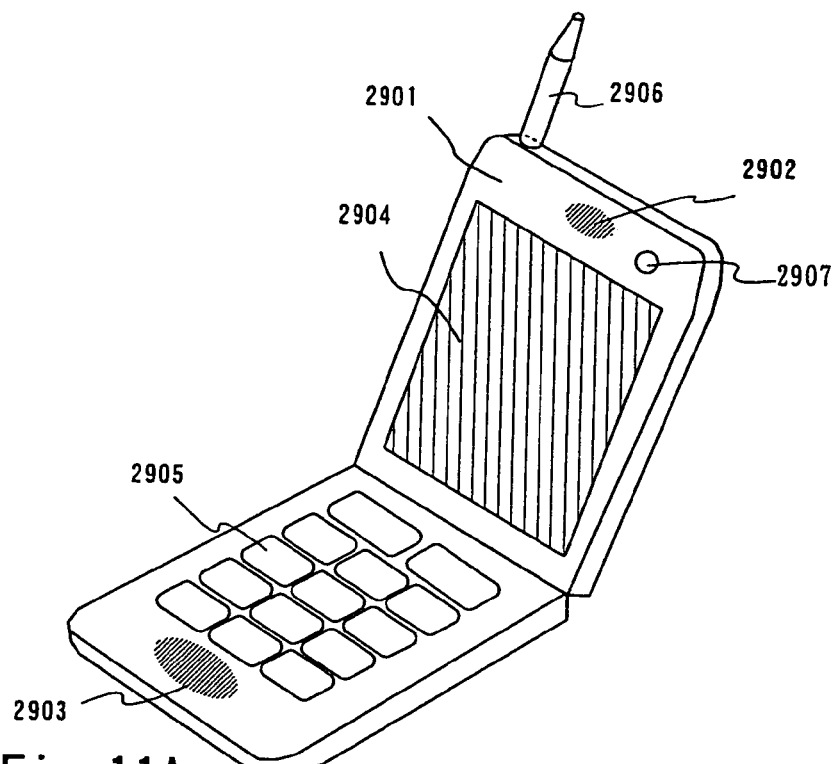
FIGS. 11A to 11C show examples of electronic equipment.

FIG. 11A shows a cellular phone including a main body 2901, a sound output portion 2902, a sound input portion 2903, a display portion 2904, an operation switch 2905, an antenna 2906 and an image input portion (CCD, image sensor or the like) 2907.

Figure 11B:
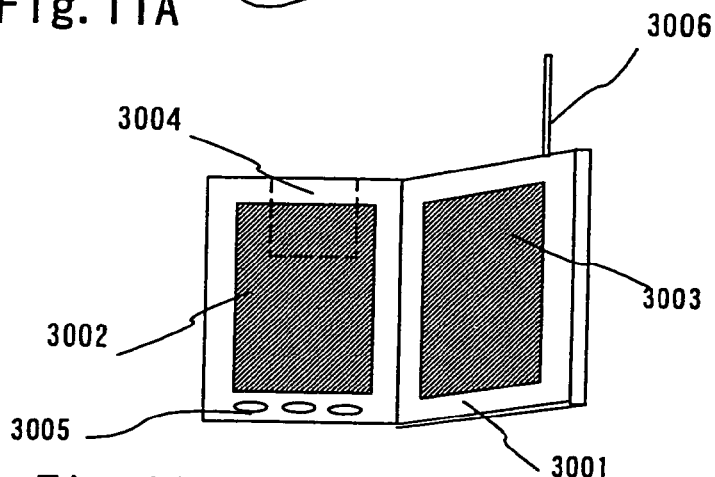

FIG. 11B shows a portable book (electronic book) including a main body 3001, display portions 3002 and 3003, a record medium 3004, an operation switch 3005 and an antenna 3006.

Figure 11C:
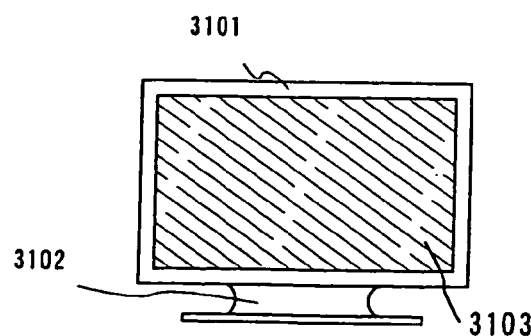

FIG. 11C shows a display including a main body 3101, a support base 3102 and a display portion 3103.

In addition, the display shown in FIG. 11C is small and medium type or large type, for example, screen of the display sized 5 to 20 inches. Moreover, it is preferable to mass-produce by executing a multiple pattern using a substrate sized 1×1 m to form such sized display section.

As has been described, the range of applying the present invention is extremely wide and is applicable to electronic equipment of all the fields. The electronic equipment of the present invention can be implemented by freely combined with the structures in Embodiments 1 to 3.

In accordance with the present invention, a number of rod shape crystal grain aggregates (domains) are formed in a semiconductor film 15 having a crystalline structure. All of the crystal grains in a certain crystal grain aggregate (domain) are considered to have the same crystal orientation, and the size of the aggregate of crystal grains (domain) is equal to or greater than approximately 1 $\mu$m, with large aggregates having a size of several tens of micrometers. A TFT having superior TFT characteristics, such as field effect mobility, can be obtained when using the semiconductor film 15 having this crystalline structure as an active layer.

What is claimed is:

1. A method of manufacturing a semiconductor device, comprising:
    a first step of forming a semiconductor film having an amorphous structure on an insulating surface;
    a second step of adding a metallic element to the semiconductor film having an amorphous structure;
    a third step of heat-treating the semiconductor film having an amorphous structure to form a semiconductor film having a crystalline structure, and then removing an oxide film from the crystalline semiconductor film surface;
    a fourth step of introducing oxygen into the semiconductor film having a crystalline structure to make an oxygen concentration within the film from $5\times10^{18}/cm^3$ to $1\times10^{21}/cm^3$;
    a fifth step of removing an oxide film on the surface of the semiconductor film having a crystalline structure; and
    a sixth step of irradiating laser light under an inert gas atmosphere or in a vacuum to level the surface of the semiconductor film having a crystalline structure.

2. A method of manufacturing a semiconductor device, comprising:
    a first step of forming a semiconductor film having an amorphous structure on an insulating surface;
    a second step of adding a metallic element to the semiconductor film having an amorphous structure;
    a third step of heat-treating the semiconductor film having an amorphous structure to form a semiconductor film having a crystalline structure;
    a fourth step of introducing oxygen into the semiconductor film having a crystalline structure to make the oxygen concentration within the film from $5\times10^{18}/cm^3$ to $1\times10^{21}/cm^3$;
    a fifth step of removing an oxide film on the surface of the semiconductor film having a crystalline structure; and
    a sixth step of irradiating laser light under an inert gas atmosphere or in a vacuum to level the surface of the semiconductor film having a crystalline structure.

3. A method of manufacturing a semiconductor device, comprising:
    a first step of forming a semiconductor film having an amorphous structure on an insulating surface;

a second step of adding a metallic element to the semiconductor film having an amorphous structure;

a third step of heat-treating the semiconductor film having an amorphous structure to form a semiconductor film having a crystalline structure, and then removing an oxide film from the crystalline semiconductor film surface;

a fourth step of introducing oxygen into the semiconductor film having a crystalline structure to make the oxygen concentration within the film from $5 \times 10^{18}/cm^3$ to $1 \times 10^{21}/cm^3$;

a fifth step of removing an oxide film on the surface of the semiconductor film having a crystalline structure;

a sixth step of irradiating laser light under an inert gas atmosphere or in a vacuum to level the surface of the semiconductor film having a crystalline structure; and a seventh step of gettering the metallic element to remove the metallic element from, or reduce the concentration of the metallic element within, the semiconductor film having a crystalline structure.

4. A method of manufacturing a semiconductor device according to claim 1, wherein a concentration of oxygen within the semiconductor film having an amorphous structure and formed by the first step is less than $5 \times 10^{18}/cm^3$.

5. A method of manufacturing a semiconductor device according to claim 2, wherein a concentration of oxygen within the semiconductor film having an amorphous structure and formed by the first step is less than $5 \times 10^{18}/cm^3$.

6. A method of manufacturing a semiconductor device according to claim 3, wherein a concentration of oxygen within the semiconductor film having an amorphous structure and formed by the first step is less than $5 \times 10^{18}/cm^3$.

7. A method of manufacturing a semiconductor device according to claim 1, wherein the fourth step is a step of irradiating laser light under an inert gas atmosphere, or in a vacuum, after oxidizing the semiconductor surface having a crystallization structure by using ozone water, the laser light having an energy density which is lower than the energy density of the laser light used in the sixth step by 30 to 60 mJ/cm².

8. A method of manufacturing a semiconductor device according to claim 2, wherein the fourth step is a step of irradiating laser light under an inert gas atmosphere, or in a vacuum, after oxidizing the semiconductor surface having a crystallization structure by using ozone water, the laser light having an energy density which is lower than the energy density of the laser light used in the sixth step by 30 to 60 mJ/cm².

9. A method of manufacturing a semiconductor device according to claim 3, wherein the fourth step is a step of irradiating laser light under an inert gas atmosphere, or in a vacuum, after oxidizing the semiconductor surface having a crystallization structure by using ozone water, the laser light having an energy density which is lower than the energy density of the laser light used in the sixth step by 30 to 60 mJ/cm².

10. A method of manufacturing a semiconductor device according to claim 1, wherein the fourth step is a step of irradiating laser light under an atmosphere containing oxygen or water molecules, the laser light having an energy density which is lower than the energy density of the laser light used in the sixth step by 30 to 60 mJ/cm².

11. A method of manufacturing a semiconductor device according to claim 2, wherein the fourth step is a step of irradiating laser light under an atmosphere containing oxygen or water molecules, the laser light having an energy density which is lower than the energy density of the laser light used in the sixth step by 30 to 60 mJ/cm².

12. A method of manufacturing a semiconductor device according to claim 3, wherein the fourth step is a step of irradiating laser light under an atmosphere containing oxygen or water molecules, the laser light having an energy density which is lower than the energy density of the laser light used in the sixth step by 30 to 60 mJ/cm².

13. A method of manufacturing a semiconductor device according to claim 1, wherein the fourth step is a step of irradiating laser light under an inert gas atmosphere, or in a vacuum, after adding oxygen by ion doping or ion implantation so that the oxygen concentration within the semiconductor film having a crystallization structure is from $5 \times 10^{18}/cm^3$ to $1 \times 10^{21}/cm^3$, the laser light having an energy density which is lower than the energy density of the laser light used in the sixth step by 30 to 60 mJ/cm².

14. A method of manufacturing a semiconductor device according to claim 2, wherein the fourth step is a step of irradiating laser light under an inert gas atmosphere, or in a vacuum, after adding oxygen by ion doping or ion implantation so that the oxygen concentration within the semiconductor film having a crystallization structure is from $5 \times 10^{18}/cm^3$ to $1 \times 10^{21}/cm^3$, the laser light having an energy density which is lower than the energy density of the laser light used in the sixth step by 30 to 60 mJ/cm².

15. A method of manufacturing a semiconductor device according to claim 3, wherein the fourth step is a step of irradiating laser light under an inert gas atmosphere, or in a vacuum, after adding oxygen by ion doping or ion implantation so that the oxygen concentration within the semiconductor film having a crystallization structure is from $5 \times 10^{18}/cm^3$ to $1 \times 10^{21}/cm^3$, the laser light having an energy density which is lower than the energy density of the laser light used in the sixth step by 30 to 60 mJ/cm².

16. A method of manufacturing a semiconductor device according to claim 1, wherein the metallic element in the above structure is a metallic element for promoting crystallization of silicon, and is one element, or a plurality of elements, selected from the group consisting of Fe, Ni, Co, Ru, Rh, Pd, Os, Ir, Pt, Cu, and Au.

17. A method of manufacturing a semiconductor device according to claim 2, wherein the metallic element in the above structure is a metallic element for promoting crystallization of silicon, and is one element, or a plurality of elements, selected from the group consisting of Fe, Ni, Co, Ru, Rh, Pd, Os, Ir, Pt, Cu, and Au.

18. A method of manufacturing a semiconductor device according to claim 3, wherein the metallic element in the above structure is a metallic element for promoting crystallization of silicon, and is one element, or a plurality of elements, selected from the group consisting of Fe, Ni, Co, Ru, Rh, Pd, Os, Ir, Pt, Cu, and Au.

* * * * *